US 6,731,559 B2

(12) United States Patent
Kawaguchi et al.

(10) Patent No.: US 6,731,559 B2
(45) Date of Patent: May 4, 2004

(54) SYNCHRONOUS SEMICONDUCTOR MEMORY DEVICE

(75) Inventors: Kazuaki Kawaguchi, Kawasaki (JP); Shigeo Ohshima, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 5 days.

(21) Appl. No.: 10/244,962

(22) Filed: Sep. 17, 2002

(65) Prior Publication Data

US 2003/0053362 A1 Mar. 20, 2003

(30) Foreign Application Priority Data

Sep. 18, 2001 (JP) .................................... 2001-284111
Aug. 29, 2002 (JP) .................................... 2002-251604

(51) Int. Cl.$^7$ ................................................ G11C 7/00
(52) U.S. Cl. ..................... 365/222; 365/233; 365/236
(58) Field of Search ............................... 365/222, 233, 365/236, 149

(56) References Cited

U.S. PATENT DOCUMENTS

| 6,032,214 A | | 2/2000 | Farmwald et al. | |
| 6,061,285 A | * | 5/2000 | Tsukikawa | 365/201 |
| 6,427,197 B1 | * | 7/2002 | Sato et al. | 711/169 |

FOREIGN PATENT DOCUMENTS

| JP | 2000-137982 | 5/2000 |
| JP | 2001-189077 | 7/2001 |

OTHER PUBLICATIONS

Sato, et al., "Fast Cycle RAM (FCRAM); a 20–ns Random Row Access, Pipe–Lines Operating DRAM"; Fujitsu Limited.

* cited by examiner

Primary Examiner—Tan T. Nguyen
(74) Attorney, Agent, or Firm—Hogan & Hartson, LLP

(57) ABSTRACT

A synchronous semiconductor memory device has a memory section which includes a memory cell array having a plurality of memory cells and which is capable of a read operation of reading information from the memory cells according to a read command and a write operation of writing information into the memory cells according to a write command. The synchronous semiconductor memory device further has a command sensing circuit which senses whether a first command inputted in synchronization with an external clock signal is the read command or the write command. The synchronous semiconductor memory device further has a bank timer circuit which, when the command sensing circuit has sensed either the read command or the write command, sets the end time of the restore operation of a row address strobe (RAS) and the start time of the precharge operation of the RAS according to the external clock signal.

21 Claims, 18 Drawing Sheets

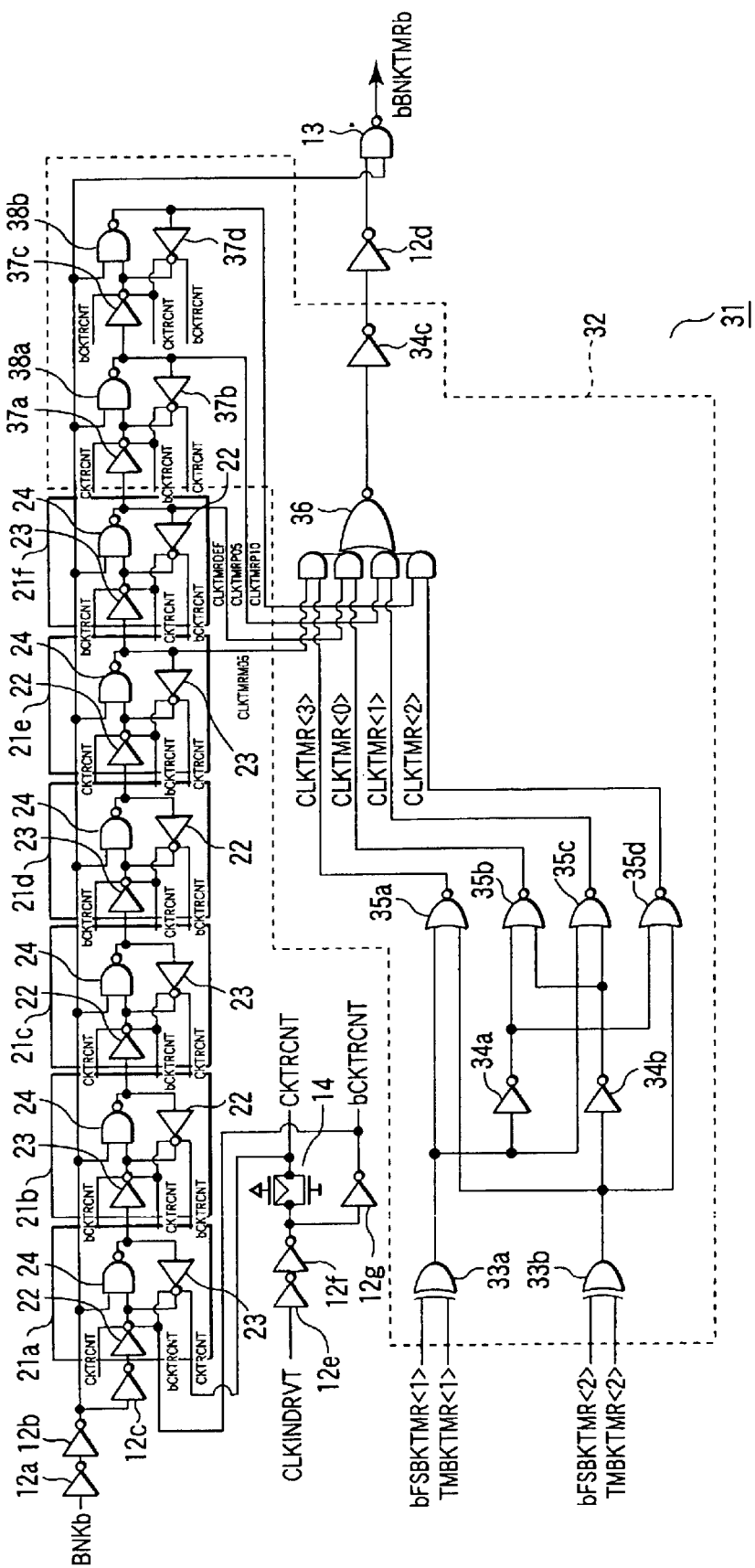
F I G. 3

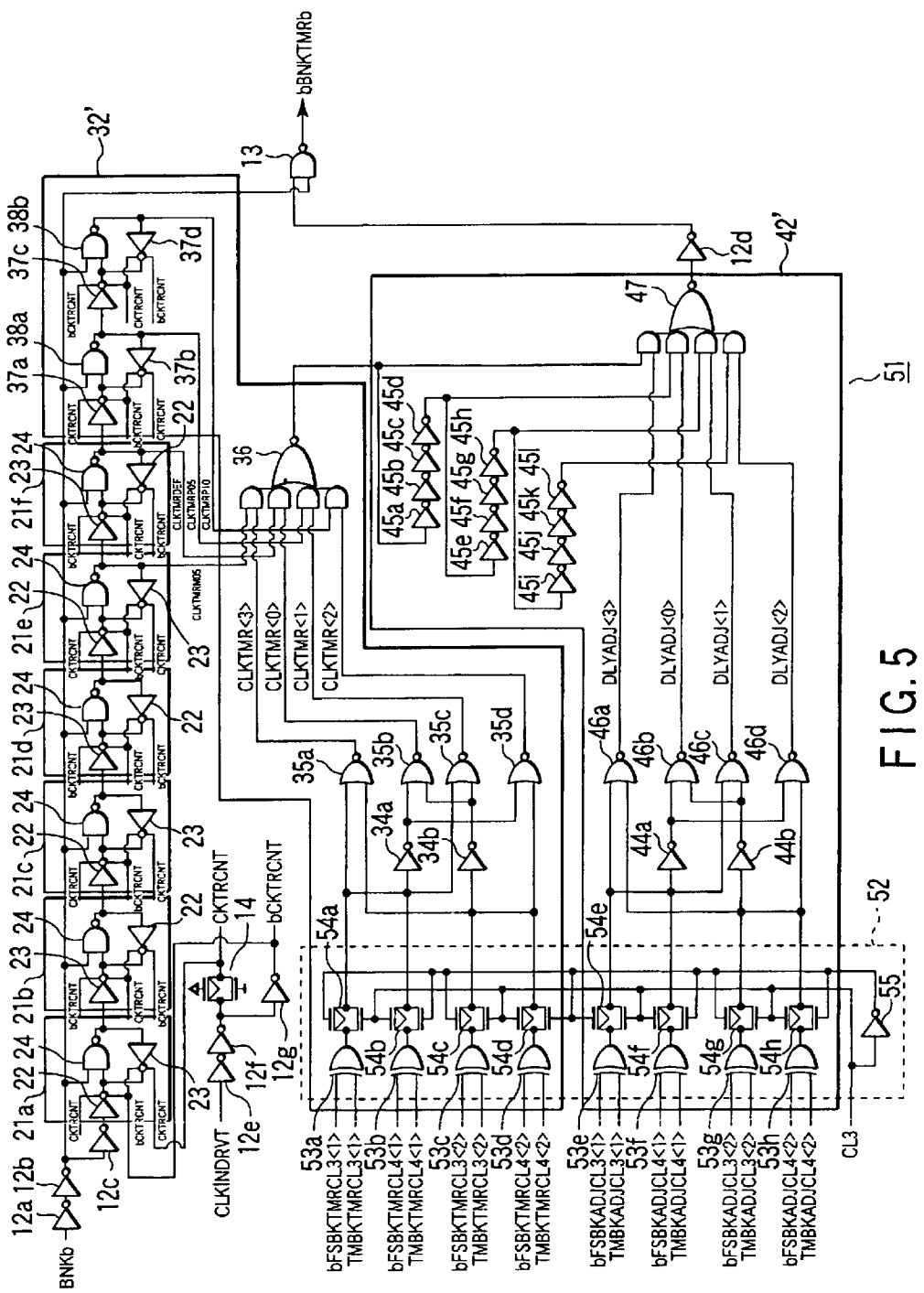
F I G. 5

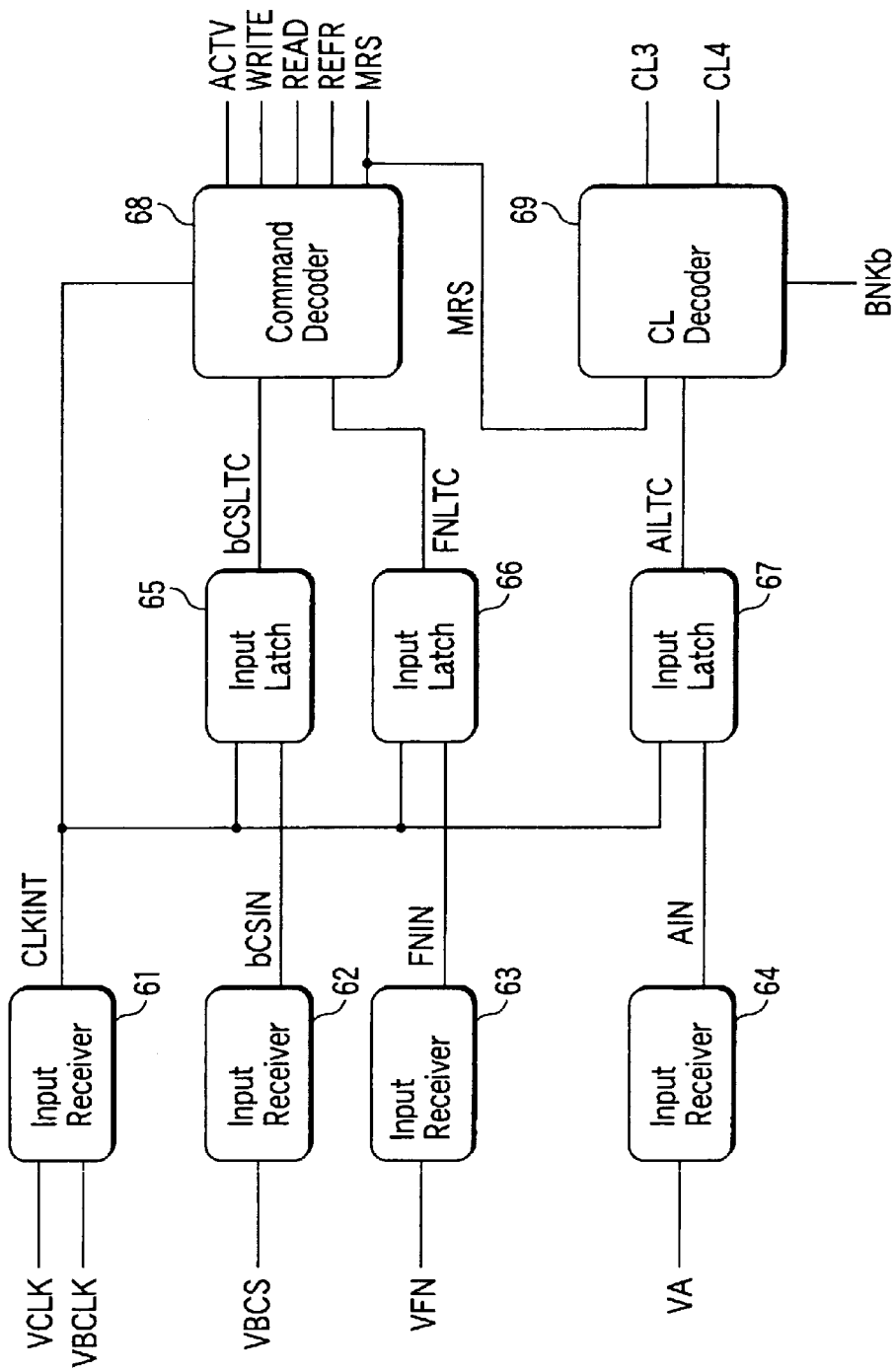
F I G. 6

1st Command

| Function | Symbol | Pin name | | | | | |
|---|---|---|---|---|---|---|---|
| | | /CS | FN (/RAS) | A14 (/WE) | A13 (/CAS) | BA1-0 | A12-0 |
| Deselect | DESL | H | X | X | X | X | X |
| Read with Auto-close | RDA | L | H | UA | UA | BA | UA |
| Write with Auto-close | WRA | L | L | UA | UA | BA | UA |

FIG. 9A

2nd Command (1clock after from RDA or WRA command)

| Function | Symbol | Pin name | | | | | |
|---|---|---|---|---|---|---|---|
| | | /CS | FN (/RAS) | A14 (/WE) | A13 (/CAS) | BA1-0 | A12-0 |
| Lower Address Latch | LAL | H | X | X | X | X | LA |
| Mode Register Set* | MRS | L | X | L | L | V | V |
| Auto-Refresh | REF | L | X | X | X | X | X |

Note* BA0=L select Standard Mode Register and
BA0=H does Extended Mode Register

FIG. 9B

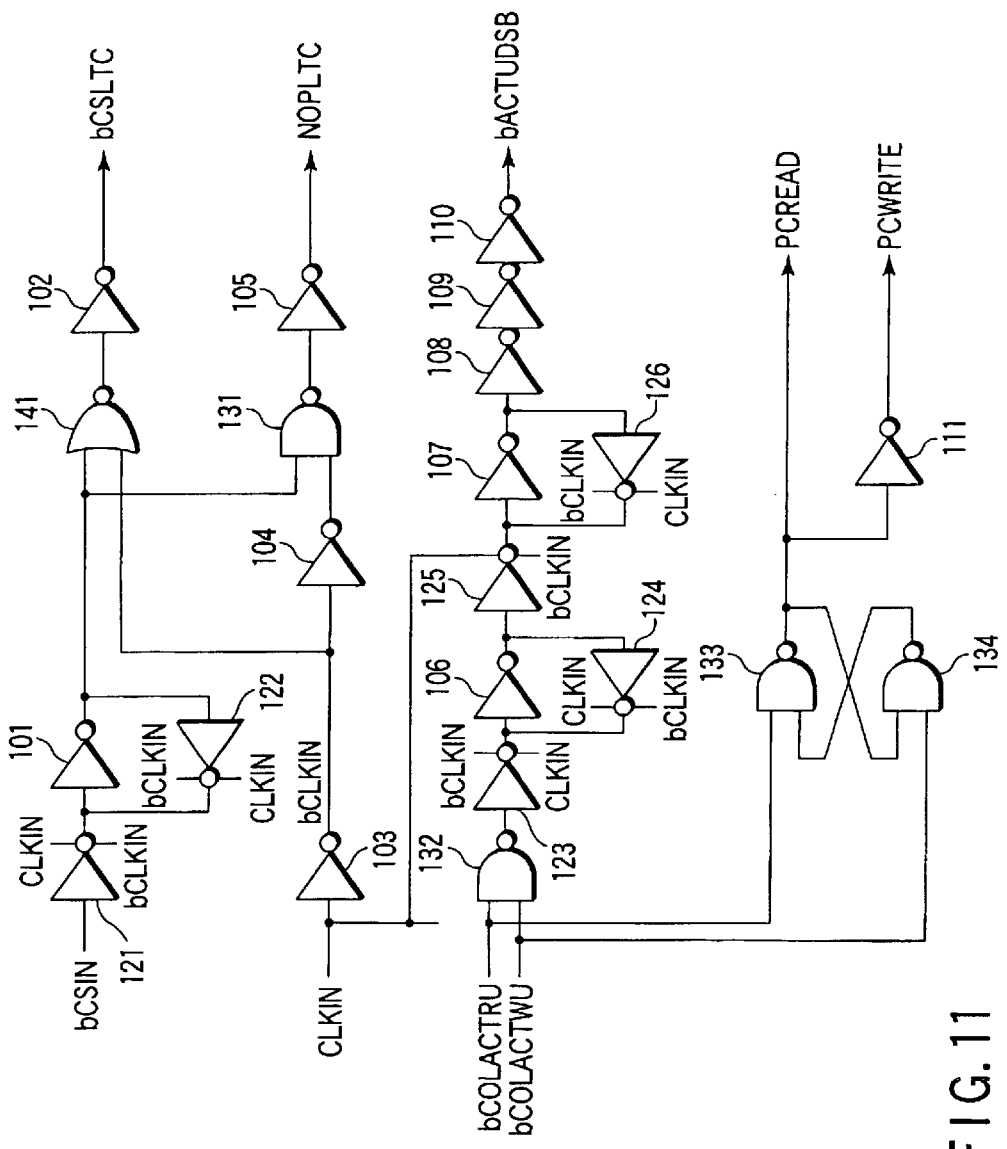
F I G. 11

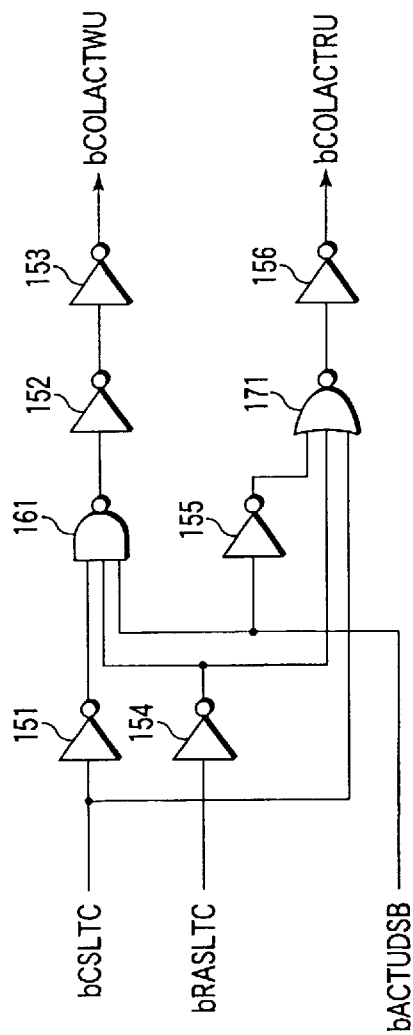
F I G. 12
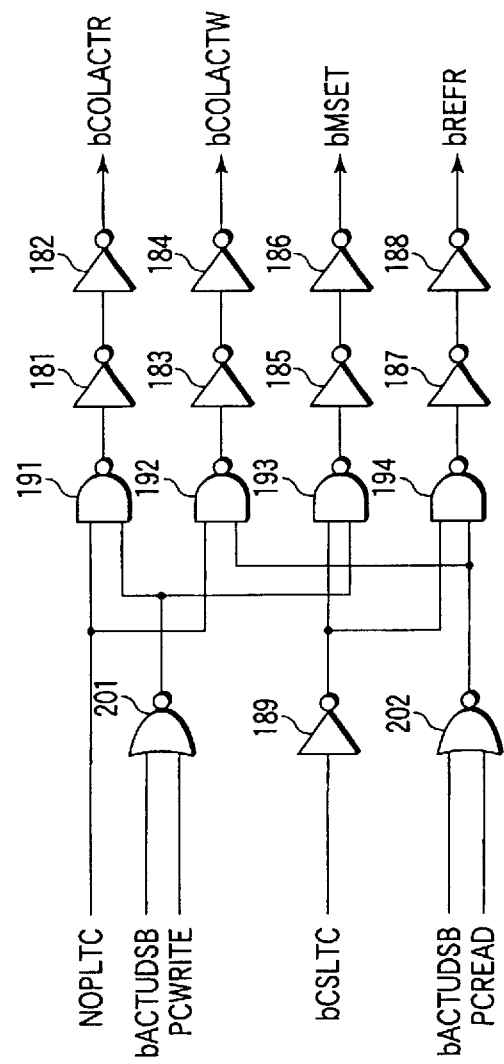
F I G. 13

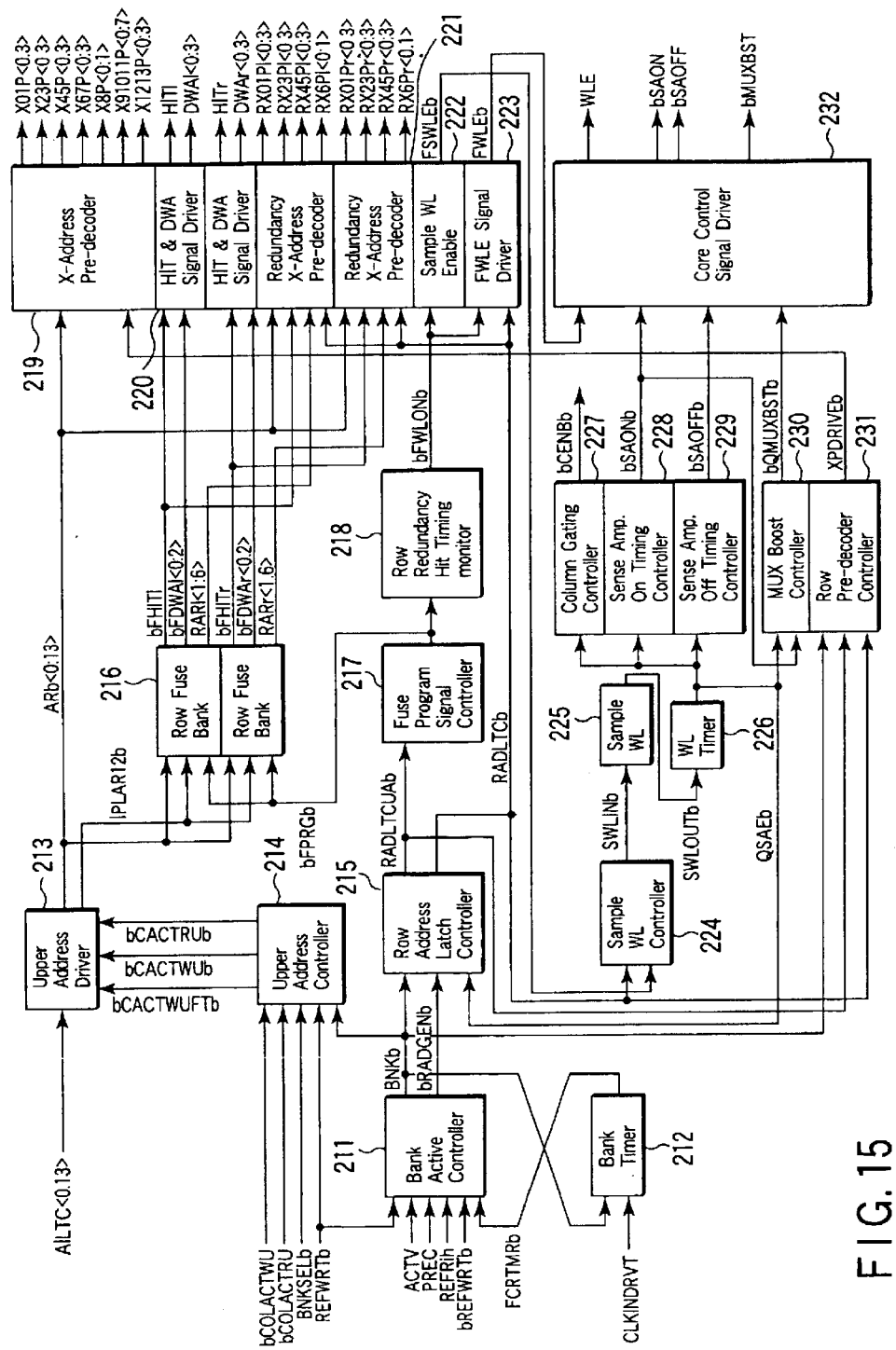
F I G. 15

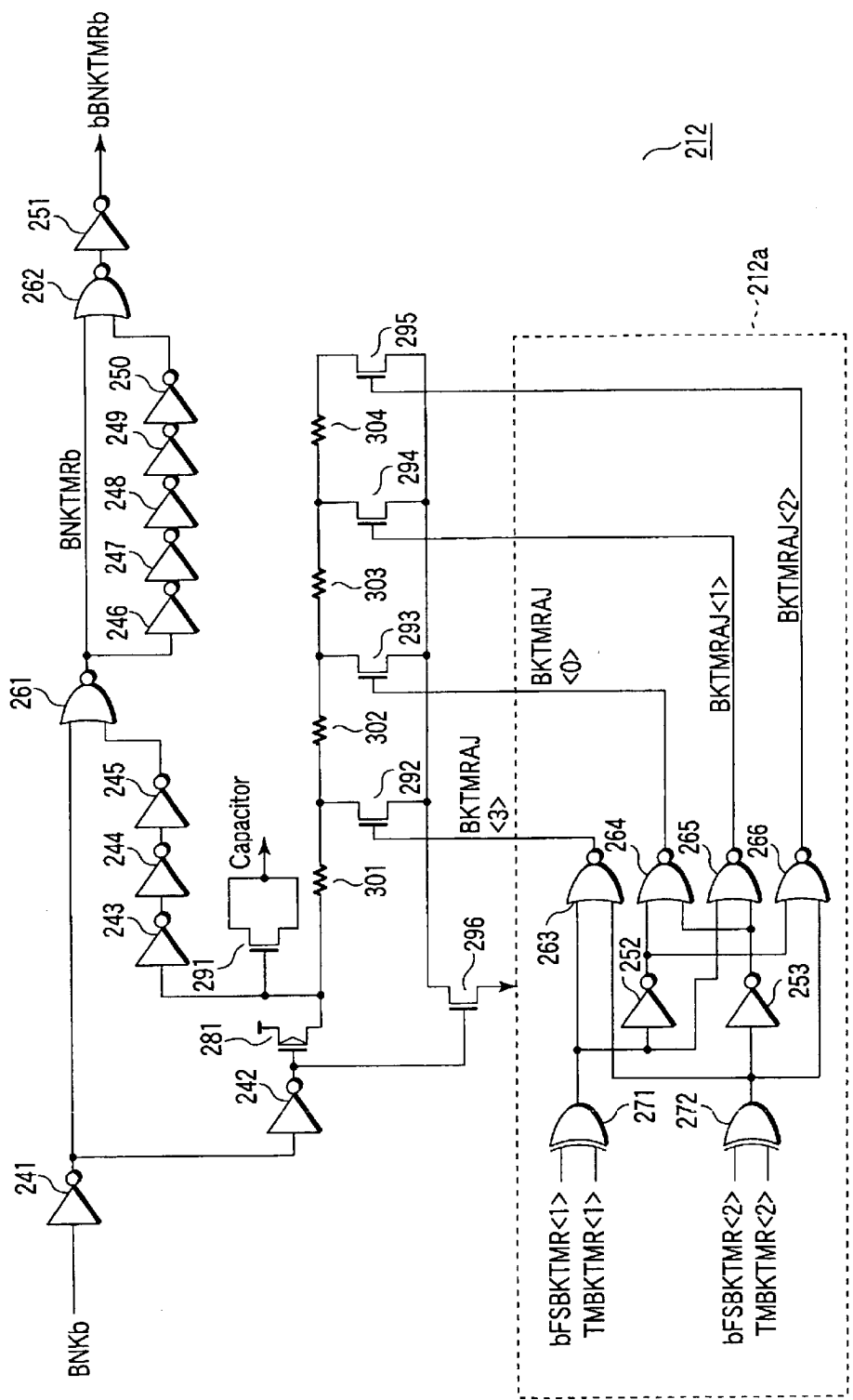
F I G. 17

SYNCHRONOUS SEMICONDUCTOR MEMORY DEVICE

CROSS-REFERENCE TO RELATED APPLICATIONS

This application is based upon and claims the benefit of priority from the prior Japanese Patent Applications No. 2001-284111, filed Sep. 18, 2001; and No. 2002-251604, filed Aug. 29, 2002, the entire contents of both of which are incorporated herein by reference.

BACKGROUND OF THE INVENTION

1. Field of the Invention

This invention relates to a synchronous semiconductor memory device. More specifically, this invention relates to a high-speed random-cycle synchronous semiconductor memory (FCRAM) which has the function of reading and writing data from and into the memory cell array at random at high speeds and which is used in, for example, a high-speed-cycle synchronous FCRAM (SDR-FCRAM) or a double-data-rate synchronous FCRAM (DDR-FCRAM) that realizes twice the data transfer rate of an SDR-FCRAM.

2. Description of the Related Art

Conventional synchronous DRAMs (SDRAMs) are such that they make the data access speed of DRAMs (dynamic random-access memories) as fast as SRAMs (static random-access memories) and enable a greater data bandwidth (the number of data bytes per unit time) at a higher clock frequency. SDRAMs have been put to practical use since the 4-Mbit/16-Mbit DRAM generations. In the 64-Mbit DRAM generation, most of the DRAMs now in use are SDRAMs.

Recently, an attempt has been made to make the data transfer rate of SDRAMs much faster. For example, double-data-rate SDRAMs (DDR-SDRAMs) that operate at a data transfer rate twice that of conventional equivalents have been proposed and are now being commercialized.

Although being faster in the data transfer rate, or being improved in the bandwidth, SDRAMs have the following problem: it is difficult to access the cell data in the memory core at higher speed. The reason for this is that, in the case of SDRAMs, the data access from a different row address as a result of the change of the row access requires a destructive read operation unique to DRAMs and an amplify operation and that it also requires a specific length of time (or core latency) for a precharge operation preceding the next core access. Therefore, it is difficult to radically speed up the core cycle time (or random cycle time tRC).

To solve this problem, a Fast Cycle RAM (FCRAM) has been proposed which performs a core access operation and a precharge operation in a pipeline manner, thereby decreasing the random cycle time tRC to less than ½ that of a conventional SDRAM (for example, see "a 20-ns Random Access Pipelined Operation DRAM," VLSI Symp. 1998). In recent years, products using such an FCRAM are going to be commercialized in the field of networks that transfer random data at high speeds, centering on LAN switches and routers, which have used SRAMs up to now.

Here, the command system including the basic operations of FCRAMs will be explained briefly (for further details, see, for example, Japanese Patent Application No. 11-373531 (Jpn. Pat. Appln. KOKAI Publication No. 2001-189077).

FIG. 8 shows how the state of FCRAM changes according to a command input. In FIG. 8, the way the command input is determined by a combination of a first command and a second command is illustrated.

FIGS. 9A and 9B show the relationship between the commands in FIG. 8 and pin inputs corresponding to the commands (in function tables).

In the FCRAM, two pins, a chip select (/CS) pin and a function control (FN=row address strobe/RAS) pin, are generally located as external terminals for inputting commands for controlling internal circuit operations. It is impossible to determine many command inputs by using only the two pins. To overcome this problem, combining a first command and a second command enables a plurality of commands to be determined by only the two pins, the /CS pin and the FN pin.

In FIG. 8, a write active command WRA (Write with Auto-close) and a read active command RDA (Read with Auto-close) are first commands. A lower address latch command LAL (Lower Address Latch), a mode register set command MRS (Mode Register Set), and an auto refresh command REF (Auto Refresh) are second commands.

As shown in FIG. 9A, as for the first commands, when the input level of the /CS pin is low and the input level of the FN pin is high, a read active command RDA is set as a command input. In addition, when the input level of the /CS pin is low and the input level of the FN pin is low, a write active command WRA is set as a command input. As shown in FIG. 9B, as for second commands, when the input level of the /CS pin is high, a lower address latch command LAL is set as a command input. Moreover, when the input level of the /CS pin is low, a mode register set command MRS and an auto refresh command REF are set as command inputs.

Specifically, as shown in FIG. 8, when each of a first command and a second command is inputted in the wait state (STANDBY), a read active command RDA or a write active command WRA is given directly. In this case, as seen from the tables shown in FIGS. 9A and 9B, the input of a command is accepted when the input level of the /CS pin is made low. The distinction between a read command and a write command is made according to the level of the input supplied to the FN pin. In this example, if the command is a read command, the FN pin is set high. If the command is a write command, the FN pin is set low.

Furthermore, a first command can be used to give a row address for sense amplifier division decoding. There is a limit to the number of pins of a package. Thus, some of the existing control pins are used as address pins, thereby suppressing an increase in the number of pins.

FIG. 10 shows the pin allocation of a double-data-rate synchronous FCRAM (DDR-FCRAM) package some of whose control pins are used as address pins, as compared with the pin allocation of a DDR-SDRAM package. Explanation will be given, taking a 66-pin TSOP (Thin Small Outline Package) standardized in JEDEC (Joint Electron Devices Engineering Council) as an example.

In the FCRAM in this example, the column address strobe (/CAS) pin and write enable (/WE) pin of the SDRAM are converted into address pins A13, A14. This increases the number of sense amplifiers to be decoded, preventing the number of sense amplifiers to be activated from being limited.

An address taken in by a first command is called an upper address UA and an address taken in by a second command is called a lower address LA.

With the rising edge of a clock in a first command, the upper address UA is taken in from the address pins A13, A14 corresponding to the /WE pin and /CAS pin and normal address pins A0 to A12. If the first command is a read command, a word line WL is selected according to the row address. Then, the data from the memory cell MC connected to the selected word line WL is read onto a bit line pair BLn, /BLn. The read-out data is amplified by a bit-line sense amplifier S/A. The input of the first command completes the operations up to this point. In FIG. 10, the /WE pin and /CAS pin change in level according to the input of addresses. Moreover, the /RAS pin is changed in level according to the FN input.

Next, after one clock cycle since the first command was inputted, any one of a lower address latch command LAL, a mode register set command MRS, and an auto refresh command REF is inputted as a second command.

The following is an explanation of a case where, in the second command, the /CS pin is set high (command LAL) and column addresses CA0 to CAj (lower addresses LA) are taken in from address pins A0 to A14. In this case, a column address is only taken in as the second command. That is, the column select line CSL corresponding to the column address is selected. In this way, the data amplified by the bit-line sense amplifier S/A is transferred to a data-line pair MDQ. Then, the data is amplified again by a read buffer (or secondary sense amplifier) DQRB. Finally, the data is outputted at an output pin.

A command decoder for realizing the aforementioned operations is composed of, for example, a controller, a first-command decoder, and a second-command decoder as shown in FIGS. 11 to 13. Specifically, FIG. 11 shows a concrete configuration of a controller for controlling the operation of the command decoder. FIG. 12 shows a concrete configuration of an upper command decoder. FIG. 13 shows a concrete configuration of a lower command decoder.

A controller shown in FIG. 11 is composed of inverters 101 to 111, clocked inverters 121 to 126, NAND gates 131 to 134, and a NOR gate 141. Specifically, an opposite-phase signal bCSIN obtained by internally buffering the external signal from the /CS pin is supplied to the input terminal of the clocked inverter 121 controlled by a signal CLKIN obtained by internally buffering an external clock signal and its opposite-phase signal bCLKIN. The input terminal of the inverter 101 is connected to the output terminal of the clocked inverter 121.

The output terminal of the clocked inverter 122 controlled by signals CLKIN, bCLKIN is connected to the input terminal of the inverter 101. The input terminal of the clocked inverter 122 is connected to the output terminal of the inverter 101.

The output terminal of the inverter 101 is connected to one input terminal of the NOR gate 141 and one input terminal of the NAND gate 131. The output terminal of the inverter 103 is connected to the other input terminal of the NOR gate 141. The output terminal of the inverter 104 is connected to the other input terminal of the NAND gate 131. The output terminal of the inverter 103 is connected to the input terminal of the inverter 104. The signal CLKIN is supplied to the input terminal of the inverter 103.

The input terminal of the inverter 102 is connected to the output terminal of the NOR gate 141. The opposite-phase signal bCSLTC is outputted from the output terminal of the inverter 102. The signal bCSLTC is a signal obtained by internally buffering the external input /CS and latching it for half a clock.

The input terminal of the inverter 105 is connected to the output terminal of the NAND gate 131. A signal NOPLTC is outputted from the output terminal of the inverter 105.

On the other hand, a signal bCOLACTRU indicating that a command RDA has been inputted is supplied to one input terminal of each of NAND gates 132, 133. A signal bCOLACTWU indicating that a command WRA has been inputted is supplied to the other input terminal of each of the NAND gates 132, 134.

The output terminal of the NAND gate 132 is connected to the input terminal of the clocked inverter 123 controlled by signals bCLKIN, CLKIN. The input terminal of the inverter 106 is connected to the output terminal of the clocked inverter 123. The input terminal of the clocked inverter 125 controlled by signals CLKIN, bCLKIN is connected to the output terminal of the inverter 106. The input terminal of the inverter 107 is connected to the output terminal of the clocked inverter 125. Three stages of inverters 108, 109, 110 are connected to the output terminal of the inverter 107. An opposite-phase signal bACTUDSB is outputted from the output terminal of the third-stage inverter 110.

The output terminal of the clocked inverter 124 controlled by signals CLKIN, bCLKIN is connected to the input terminal of the inverter 106. The input terminal of the clocked inverter 124 is connected to the output terminal of the inverter 106. The output terminal of the clocked inverter 126 controlled by signals bCLKIN, CLKIN is connected to the input terminal of the inverter 107. The input terminal of the clocked inverter 126 is connected to the output terminal of the inverter 107.

The output terminal of the NAND gate 134 is connected to the other input terminal of the NAND gate 133. The output terminal of the NAND gate 133 is connected to one input terminal of the NAND gate 134. A signal PCREAD is outputted from the output terminal of the NAND gate 133. The output terminal of the NAND gate 133 is connected to the input terminal of the inverter 111. A signal PCWRITE is outputted from the output terminal of the inverter 111.

The upper command decoder shown in FIG. 12 is composed of inverters 151 to 156, a NAND gate 161, and a NOR gate 171. Specifically, the controller shown in FIG. 11 supplies a signal bCSLTC to the input terminal of the inverter 151. A signal bRASLTC is supplied to the input terminal of the inverter 154. The signal bRASLTC is a signal obtained by internally buffering an external input /RAS(FN) and latching it for half a clock.

The output terminal of the inverter 151 is connected to a first input terminal of the NAND gate 161. The output terminal of the inverter 154 is connected to a second input terminal of the NAND gate 161. The output terminal of the inverter 110 shown in FIG. 11 is connected to a third input terminal of the NAND gate 161. Then, a signal BACTUDSB is supplied from the output terminal of the inverter 110.

The input terminal of the inverter 152 is connected to the output terminal of the NAND gate 161. The input terminal of the inverter 153 is connected to the output terminal of the inverter 152. A signal bCOLACTWU is outputted from the output terminal of the inverter 153 and then supplied to the controller.

On the other hand, the output terminal of the inverter 155 is connected to a first input terminal of the NOR gate 171. The output terminal of the inverter 110 shown in FIG. 11 is connected to the input terminal of the inverter 155. The output terminal of the inverter 154 is connected to a second input terminal of the NOR gate 171. The output terminal of the inverter 102 shown in FIG. 11 is connected to a third input terminal of the NOR gate 171. Then, an opposite-phase signal bCSLTC is supplied to the output terminal of the inverter 102.

The input terminal of the inverter 156 is connected to the output terminal of the NOR gate 171. Then, an opposite-phase signal bCOLACTRU is outputted from the output terminal of the inverter 156 and then supplied to the controller.

The circuit of FIG. 12 is configured so as to reduce the number of stages by receiving each signal with the NOR gate 171. This makes the random access time tRAC faster.

The lower command decoder shown in FIG. 13 is composed of inverters 181 to 189, NAND gates 191 to 194, and NOR gates 201, 202. Specifically, the controller shown in FIG. 11 supplies a signal NOPLTC to one input terminal of each of the NAND gates 191, 192. The controller of FIG. 11 supplies a signal bCSLTC to the input terminal of the inverter 189. The output terminal of the inverter 189 is connected to one input terminal of each of the NAND gates 193, 194.

The controller of FIG. 11 supplies signal bACTUDSB and signal PCWRITE to the corresponding input terminals of the NOR gate 201. The output terminal of the NOR gate 201 is connected to the other input terminal of each of the NAND gates 191, 193.

The controller of FIG. 11 supplies signal bACTUDSB and signal PCREAD to the corresponding input terminals of the NOR gate 202. The output terminal of the NOR gate 202 is connected to the other input terminal of each of the NAND gates 192, 194.

The output terminal of the NAND gate 191 is connected to the input terminal of the inverter 181. The input terminal of the inverter 182 is connected to the output terminal of the inverter 181. An opposite-phase signal bCOLACTR is outputted from the output terminal of the inverter 182. The signal bCOLACTR is a signal that indicates a lower address latch command LAL has been inputted in the clock cycle following a read active command RDA.

The output terminal of the NAND gate 192 is connected to the input terminal of the inverter 183. The input terminal of the inverter 184 is connected to the output terminal of the inverter 183. An opposite-phase signal bCOLACTW is outputted from the output terminal of the inverter 184. The signal bCOLACTW is a signal that indicates a lower address latch command LAL has been inputted in the clock cycle following a write active command WRA.

The output terminal of the NAND gate 193 is connected to the input terminal of the inverter 185. The input terminal of the inverter 186 is connected to the output terminal of the inverter 185. An opposite-phase signal bMSET is outputted from the output terminal of the inverter 186. The signal bMSET is a signal that indicates a mode register set command MRS has been inputted in the clock cycle following a read active command RDA.

The output terminal of the NAND gate 194 is connected to the input terminal of the inverter 187. The input terminal of the inverter 188 is connected to the output terminal of the inverter 187. An opposite-phase signal bREFR is outputted from the output terminal of the inverter 188. The signal bREFR is a signal that indicates an auto refresh command REF has been inputted in the clock cycle following a write active command WRA.

Next, the operations of the circuits shown in FIGS. 11 to 13 will be explained by reference to a timing chart shown in FIG. 14. When a first command is inputted, signal bCSLTC and signal bRASLTC change according to the potential VBCS of the /CS pin and the potential VFN of the FN pin. Then, signal bCOLACTWU (or, signal bCOLACTRU) goes low. At this time, the corresponding one of signal PCWRITE or signal PCREAD in the controller goes high.

Signal bACTUDSB goes low during only one clock cycle starting with the falling of clock signal CLKIN since a first command was inputted. This makes it possible to accept the next second command.

A signal NOPLTC is a signal for sensing that signal bCSIN goes high with the timing of the rising of clock signal CLKIN, or that the mode is in NP (No Operating). Thus, when a lower address latch command LAL is inputted in inputting a second command, signal NOPLTC goes high. Signal bCOLACTW goes low, when the following three conditions are fulfilled: signal NOPLTC is high, signal bACTUBSB is low, and signal PCWRITE is high (=signal PCREAD is low). This makes it possible to sense that a lower address latch command LAL has been inputted, while discriminating between a read and a write operation.

When an auto refresh command REF or a mode register set command MRS is inputted in inputting a second command, signal bCSLTC goes low. Whether the command REF or MRS is inputted depends on whether the first command is a write active command WRA or a read active command RDA.

When signal bACTUDSB goes low, signal BREFR and signal bMSET go low, depending on the state of signal FCREAD/FCWRITE. In this case, since the /CS pin is at the low level, a first-command command decoder operates. To prevent the command decoder from operating, signal bACTUDSB is inputted at the same time.

The aforementioned operations produce the effects shown in the following items (A) and (B).

(A) A first command determines read/write. Therefore, it is possible to take in a row address and simultaneously start not only the operation of peripheral circuits but also the operation of the memory core. This makes the start of random access earlier than the determination of the start of the memory core from the second command. That is, random access time tRAC is made one cycle earlier automatically.

(B) A first command determines read/write. Therefore, in a second command, only a lower address LA is taken in. As a result, the time from when a column select line CSL is selected until the data is outputted becomes shorter than before. This makes random access time tRAC faster. Moreover, the transfer of the data to a peripheral circuit can be finished earlier. This enables the precharge operation of bit lines BL, bBL to be brought forward after the word line WL is reset. That is, it is possible to make faster not only random access time tRAC but also random cycle time tRC.

What has been explained is about the basic operation of the command system of the FCRAM. As described above, a first command determines read/write. The RAS restore operation of the core, the selection of column select lines CSL, and the RAS precharge operation are carried out in a pipeline manner. This makes the random cycle time tRC equal to or less than ½ that of a conventional equivalent. The realization of the pipeline operation makes the FCRAM different greatly from a conventional SDRAM/DDR-SDRAM.

FIG. 15 shows a system configuration of the ROW control circuit of the FCRAM that performs RAS restore operations, the selection of column select lines CSL, and RAS precharge operations in a pipeline manner.

The ROW control circuit of the FCRAM includes a bank active controller 211, a bank timer 212, an upper address driver 213, an upper address controller 214, a row address latch controller 215, a row fuse bank 216, a fuse program signal controller 217, a row redundancy hit timing monitor 218, an X address predecoder 219, a HIT (hit signal) & DWA (disable word line active signal) signal driver 220, a redundancy X address predecoder 221, a sample word line enable circuit 222, an FWLE (F bank word line enable sense signal) signal driver 223, a sample word line controller 224, a sample word line 225, a word line timer 226, a column gating controller 227, a sense amp on timing controller 228, a sense amp off timing controller 229, a MUX boost controller 230, a row predecoder controller 231, and a core control signal driver 232.

Next, referring to FIG. 16, the operation of the ROW control circuit of the FCRAM will be explained. When an external clock signal VCLK rises, a first command (write active command WRA or read active command RDA) is inputted. This makes the internal command sense signal bCOLACTWU (when the first command is WRA) or bCOLACTRU (when the first command is RDA) low during half a clock. As a result of the change of the high level to the low level, the signal bCACTWUFTb (when the first command is WRA) or bCACTRUb (when the first command is RDA) goes low.

The FCRAM uses a late write system. Therefore, when the first command is WRA, the upper address UA previously loaded into the upper address driver 213 of FIG. 15 in inputting the command WRA in the preceding cycle is transferred as a fuse bank address ARbx. When the first command is RDA, the externally inputted upper address UA is transferred as a fuse bank address ARbx. As a result, X addresses X01Pbx, X23Pbx, X45Pbx, X67Pbx, X8Pby (x=0 to 3, y=0 to 1) are transferred to the core via the X address predecoder 219 of FIG. 15.

In parallel with this, when the external clock signal VCLK rises, the input of the first command is accepted, with the result that the internal command sense signal bACTV goes low. The signal bACTV performs the same operation, regardless of whether the first command is WRA or RDA.

As a result of the change of the signal bACTV from the high level to the low level, both signal BNKb and signal RADLTCb go high. In response to signal RADLTCb going high, signal XPDRIVEb goes high. This causes X addresses X91011Pbz, X1213Pbx (z=0 to 7) to be transferred to the core. As a result of the change of signal XPDRIVEb from the low level to the high level, MUX on the unselected array side of the shared sense amplifier goes low.

Next, in response to signal RADLTCb going high, signal bFPRGb goes high. Signal bFPRGb is a signal used to determine from the result of sensing the fuse information whether to switch to the redundancy circuit for word lines WL. When the sensing is completed, a signal bFWLONb for activating the word line WL goes high.

In response to signal bFWLONb going high, signal FWLEb goes high. As a result, signal EQL (equalize control signal) on the selected array side goes low. In response to signal EQL going high, the word line WL goes high. Moreover, MDQS (master DQ switch control signal) that controls the gate of a transistor for connecting a MDQ (master DQ) line and an LDQ (local DQ) line goes high. Signal LDQEQ that provides equalize control of the LDQ line goes low.

In parallel with this, when receiving the high level of signal bFWLONb, signal FSWLEb goes high. As a result, a signal SWLINb (sample word line) that imitates the active timing of the word lines WL goes high. Then, a sense amplifier control signal QSAEb goes high. This makes signal bSAONb go low.

In response to the signal bSAONb going low, NSET, PSET (sense amp activating signal) goes high and the opposite-phase signal bPSET goes low. At the same time, signal bQMUXBSTb goes low with a delay of a specific length of time after signal bSAONb goes low. As a result, MUX on the selected array side shifts in level from an internal power supply VINT to an internal power supply VPP (VINT<VPP).

At the same time, in response to the level change of signal QSAEb, signal bCENBb that provides gating control of the column-system circuits goes low. The system is configured to select a column select line CSL in response to the change of signal bCENBb from the high level to the low level. Although the CSL selection is included in a series of pipeline operations in the FCRAM, a detailed explanation of CSL control included in the column-system circuit group will be omitted. What has been explained above is about the RAS restore operation.

Next, a RAS precharge operation will be explained. Use of the bank timer 212 of FIG. 15 enables signal BNKb to keep at the high level for a specific length of time. After the specific length of time has elapsed, signal BNKb goes low. This causes a RAS precharge operation to start.

In response to signal BNKb going low, signal RADLTCb and signal XPDRIVEb go low. In response to signal RADLTCb going low, signal FWLEb goes low. In addition, signal SWLINb, and the potential of the word lines WL of the core, signal MDQS go low.

The change of signal SWLINb from the high level to the low level causes signal QSAEb to change to the low level and signal bCENBb to change to the high level. In addition, signal bSAOFFb goes low. This causes signals EQL, LDQEQ, bPSET to change to the high level and signals NSET, PSET to change to the low level. MUX shifts to VINT.

At the same time, the change of signal RADLTCb from the high level to the low level causes X addresses X91011Pbz, X1213Pbx, bFPRGb to change to the low level. Then, signals bFWLONb, FSWLEb change to the low level.

As seen from the above explanation, the timing (or time) of the end of the RAS restore operation and the timing of the start of the RAS precharge operation are determined by the delay time in the bank timer 212 of FIG. 15

FIG. 17 shows a circuit configuration of the bank timer 212 for determining the timing of the end of the RAS restore operation and the timing of the start of the RAS precharge operation. Explanation will be given, taking the bank timer in a general FCRAM as an example.

The bank timer 212, which normally makes use of a CR delay of capacitors and resistance elements, is composed of inverters 241 to 253, NOR gates 261 to 266, excusive OR gates 271, 272, a p-channel transistor 281, n-channel transistors 291 to 296, and resistance elements 301 to 304.

In the above configuration, a CR delay is produced by using the n-channel transistor 291 and resistance elements 301 to 304. A circuit 212a enclosed by a dotted line is a decode circuit for changing the CR delay.

In the initial state, test mode signals TMBKTMR<1>, TMBKTMR<2> are both at the low level. Test mode entry causes test mode signals TMBKTMR<1>, TMBKTMR<2> to change to the high level. The entry of test mode signals TMBKTMR<1>, TMBKTMR<2> can be controlled independently.

Furthermore, in the initial state, fuse signals bFSBKTMR<1>, bFSBKTMR<2> are both at the high level. Fuse blowout causes fuse signals bFSBKTMR<1>, bFSBKTMR<2> to change from the high level to the low level. The blowout of fuse signals bFSBKTMR<1>, bFSBKTMR<2> can be controlled independently.

In the initial state, the output BKTMRAJ<0> of the NOR gate 264 goes high. This causes the n-channel transistor 293 to turn on.

For example, suppose test mode signal TMBKTMR<1> changes to the high level and fuse signal bFSBKTMR<1> changes to the low level. Then, the output BKTMRAJ<1> of the NOR gate 265 goes high. This enables the CR delay to be increased.

Furthermore, it is assumed that test mode signal TMBKTMR<1> changes to the high level as a result of a test mode entry after fuse signal bFSBKTMR<1> changes to the low level. In this case, the CR delay is set to the same value as in the initial state.

The following is an explanation of a case where test mode signal TMBKTMR<2> changes to the high level or fuse signal bFSBKTMR<2> changes to the low level. In this case, the output BKTMRAJ<2> of the NOR gate 266 goes high. This enables the CR delay to be increased to the maximum.

Moreover, it is assumed that test mode signal TMBKTMR<2> changes to the high level as a result of a test mode entry after fuse signal bFSBKTMR<2> changes to the low level. In this case, the CR delay is set to the same value as in the initial state.

The following is an explanation of a case where test mode signals TMBKTMR<1> and TMBKTMR<2> both change to the high level and fuse signals bFSBKTMR<1> and bFSBKTMR<2> both change to the low level. In this case, the output BKTMRAJ<3> of the NOR gate 263 goes high. This enables the CR delay to be decreased.

Furthermore, it is assumed that test mode signals TMBKTMR<1>, TMBKTMR<2> both change to the high level as a result of a test mode entry after fuse signals bFSBKTMR<1>, bFSBKTMR<2> both change to the low level. In this case, the CR delay is set to the same value as in the initial state.

The example of the configuration of the general bank timer 212 using a CR delay has been explained above. The bank timer 212 using a CR delay is one example. A circuit that imitates the configuration of word lines WL in the core or an inverter delay circuit are generally used in the bank timer.

Next, referring to FIG. 18, the internal operation of the bank timer 212 will be explained. A first command (write active command WRA or read active command RDA) is inputted. Then, signal BNKb goes high. In response to the change of signal BNKb from the low level to the high level, signal BNKTMRb also changes to the high level.

On the other hand, after a specific CR delay (in Self Timer) has elapsed since the change of signal BNKb from the low level to the high level, signal BNKTMRb changes to the low level. This causes signal bBNKTMRb to change to the low level for a specific length of time. In response to the change of signal bBNKTMRb from the high level to the low level, signal BNKb changes to the low level. The change of signal BNKb from the high level to the low level completes the RAS restore operation (RAS Active). Then, an RAS precharge operation is started.

FIG. 19 shows an example of the configuration of the core (sense amplifiers and cell array) in which an RAS restore operation and an RAS precharge operation are actually carried out, using the time set in the bank timer 212.

The core is composed of cell arrays 311, 312, bit-line equalize circuits (precharge circuits) 313, 314, a cell array switching transistor pair 315, 316, a data transfer gate 317, and a sense amplifier (S/A) 318.

In the cell arrays 311, 312, word lines WLn (n=1, 2, ...) are connected to the respective gates of the MOS transistors Q constituting memory cells MCn. One of bit lines BL, bBL is connected to one of the source and drain of each MOS transistor Q. A cell capacitor C is connected to the other of the source and drain of each MOS transistor Q.

The bit-line equalize circuits 313, 314 are each composed of equalize n-channel transistors 313a, 313b to which equalize internal potential VBLEQ! is applied and 314a, 314b and bit-line short n-channel transistors 313c, 314c, respectively.

The cell array switching transistor pair 315, 316 are composed of MUX n-channel transistors 315a, 315b and 316a, 316b.

The data transfer gate 317 is composed of switching n-channel transistors 317a, 317b.

The sense amplifier 318 is composed of sense amp n-channel transistors 318a, 318b and p-channel transistors 318c, 318d.

When the data is read, the cell array switching transistor pair 315, 316 connects one of the cell arrays 311, 312 to the bit lines BL, bBL. For example, when the cell array 311 is connected to the bit lines BL, bBL, word line WLn and bit lines BL, bBL are selectively activated. As a result, one memory cell MCn in the cell array 311 is selected.

An equalize control signal EQLr is supplied to the bit-line equalize circuit 313. This causes the bit lines BL, bBL to be equalized (precharged) to voltage level $V_{BLEQ}$ (=½ $V_{BLH}$) beforehand. As a result, when the word line WLn and bit lines BL, bBL are activated, the potentials of the bit lines BL, bBL are varied minutely according to a potential corresponding to the data stored in the cell capacitor C of the selected memory cell MCn. A minute change in the potential is amplified by the sense amplifier 318. Thereafter, the amplified change is outputted via the data transfer gate 317 to the data lines LDQ, bLDQ.

The way of reading the data from the cell array 312 is almost the same as in the cell array 311 except that the cell array switching transistor pair 315, 316 connects the cell array 312 to the bit lines BL, bBL.

Next, the operations of the word line WLn, equalize control signal EQLr, bit lines BL, bBL, memory cell MCn, and column select line CSL in the core will be explained by reference to FIG. 20. Suppose "1" data is written.

When a first command WRA is received, the equalize control signal EQLr changes to the low level. Then, the potential of word line WL1 goes high. As a result, the potentials of the bit lines BL, bBL are sensed. Thereafter, the potential of the column select line CSL goes high, which causes the write data to be transferred to the bit lines BL, bBL.

After the write data is transferred, the bit line BL is restored. Word line WL1 goes low after a specific time has elapsed. Thereafter, the equalize control signal EQL goes high. This starts the operation of equalizing the bit lines BL, bBL.

In FIG. 20, it is assumed that the ideal times are set as the timing of the end of the RAS restore operation and the timing of the start of the RAS precharge operation. However, the conventional bank timer 212 of FIG. 17 sets the timing of the end of the RAS restore operation and the timing of the start of the RAS precharge operation by using a CR delay. In general, resistance elements vary greatly from process to process. They also vary greatly with external factors, including temperature dependence or voltage dependence. For this reason, the CR delay is expected to increase or decrease greatly, depending on various conditions.

Specifically, when the RAS restore time (tRAS) becomes shorter because of the power supply voltage, temperature, or processes as shown in FIG. 21, the cell will be restored insufficiently. This will make it impossible to secure a sufficient sense margin for the next cycle.

When the RAS restore time (tRAS) becomes too long, for example, the RAS precharge time (tRP) will decrease as shown in FIG. 22. This will cause the bit lines BL, bBL to be equalized insufficiently. As a result, cell data destruction will take place in the sense operation in the next cycle.

Furthermore, suppose the CR delay decreases in a long clock cycle (tCK). Then, a RAS precharge operation is started before the column operation is completed, which results in an erroneous operation.

This is a serious problem that can occur in the timer circuit or inverter delay circuit imitating the operation of the core, although the seriousness of the problem differs according to the situation.

BRIEF SUMMARY OF THE INVENTION

According to an aspect of the present invention, there is provided a synchronous semiconductor memory device comprising: a memory section which includes a memory cell array having a plurality of memory cells and which is capable of a read operation of reading information from the memory cells according to a read command and a write operation of writing information into the memory cells according to a write command; a command sensing circuit which senses whether a first command inputted in synchronization with an external clock signal is the read command or the write command; and a bank timer circuit which, when the command sensing circuit has sensed either the read command or the write command, sets the end time of the restore operation of a row address strobe (RAS) and the start time of the precharge operation of the RAS according to the external clock signal.

BRIEF DESCRIPTION OF THE SEVERAL VIEWS OF THE DRAWING

FIG. 3 is a circuit diagram showing a configuration of a bank timer used in an FCRAM according to a second embodiment of the present invention;

FIG. 5 is a circuit diagram showing a configuration of a bank timer used in an FCRAM according to a fourth embodiment of the present invention;

FIG. 6 is a block diagram showing a configuration of a control circuit for controlling the timing of the changing of CAS latency according to a fifth embodiment of the present invention;

FIGS. 9A and 9B are function tables listing the relationship between the command input shown in FIG. 8 and the pin input corresponding to the command input;

FIG. 11 is a circuit diagram showing a configuration of a controller for controlling the operation of a command decoder that decodes the command input;

FIG. 12 is a circuit diagram showing a configuration of an upper command decoder;

FIG. 13 is a circuit diagram showing a configuration of a lower command decoder;

FIG. 15 is a block diagram showing a configuration of the ROW control circuit of the FCRAM that carries out RAS restore operations and RAS precharge operations in a pipeline manner;

FIG. 17 is a circuit diagram of a bank timer using a CR delay to help explain the prior art and its problem;

DETAILED DESCRIPTION OF THE INVENTION

Hereinafter, referring to the accompanying drawings, embodiments of the present invention will be explained.
(First Embodiment)

Figure 1:
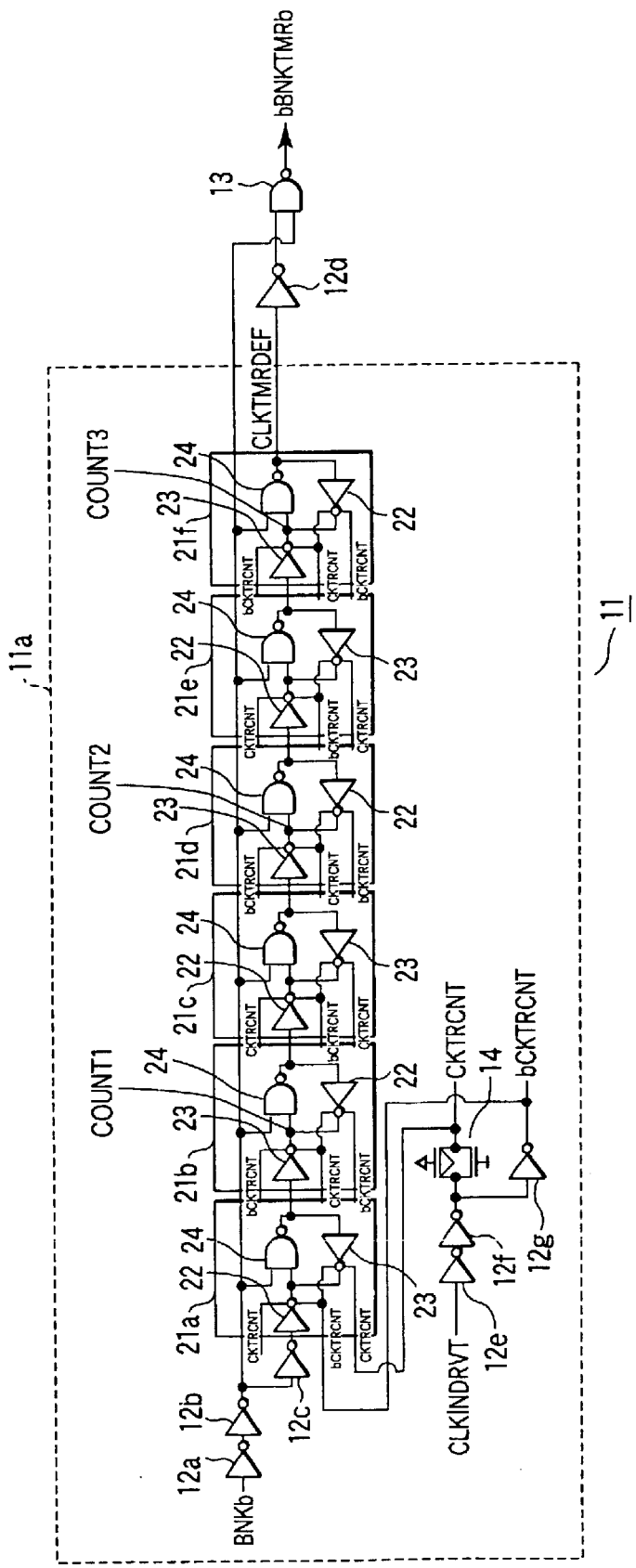
FIG. 1 is a circuit diagram showing a configuration of a bank timer used in an FCRAM according to a first embodiment of the present invention.

FIG. 1 shows a circuit configuration of a bank timer (or self-timer circuit) suitable for a synchronous semiconductor memory device (FCRAM) according to a first embodiment of the present invention.

A bank timer 11 comprises inverters 12a to 12g, a NAND gate 13, a transfer gate 14, and a plurality of stages (in this case, six stages) of delay sections 21a to 21f. Each of the delay sections 21a to 21f is composed of a clocked inverter 22 controlled by signals CKTRCNT, bCKTRCNT, a clocked inverter 23 controlled by signals bCKTRCNT, CKTRCNT, and a NAND gate 24.

Specifically, the bank active signal BNKb from the bank active controller 211 shown in FIG. 15 is supplied to the input terminal of the inverter 12a. The output terminal of the inverter 12a is connected to the input terminal of the inverter 12b. The output terminal of the inverter 12b is connected to the input terminal of the inverter 12c and one input terminal of the NAND gate 13. The output terminal of the inverter 12d is connected to the other input terminal of the NAND gate 13.

Furthermore, the output terminal of the inverter 12b is connected to one input terminal of each of the NAND gate 24 of each of the delay sections 21a to 21f. The output terminal of each of the clocked inverters 22, 23 is connected to the other input terminal of each NAND gate 24.

Of the delay sections 21a to 21f, the output terminal of the NAND gate 24 of each of the delay sections 21a, 21c, 21e is connected to the input terminal of the clocked inverter 23 and to the input terminal of the clocked inverter 23 in each of the delay sections 21b, 21d, 21f in the next stage. The output terminal of the NAND gate 24 in each of the delay sections 21b, 21d is connected to the input terminal of the clocked inverter 22 and to the input terminal of the clocked inverter 22 in each of the delay sections 21c, 21e in the next stage. Of the delay sections 21a to 21f, the output terminal of the inverter 12c is connected to the input terminal of the clocked inverter 22 in the delay section 21a in the first stage. In the delay section 21f in the final stage, the output terminal of the NAND gate 24 is connected to the input terminal of the clocked inverter 22 and to the input terminal of the inverter 12d.

On the other hand, signal CLKINDRVT is supplied to the input terminal of the inverter 12e. Signal CLKINDRVT is an internal signal obtained by converting external clock signal VCLK with an input receiver (not shown). The output terminal of the inverter 12e is connected to the input terminal of the inverter 12f. The output terminal of the inverter 12f is connected to the input terminal of each of the inverter 12g and transfer gate 14. The output terminals of the inverter 12g and transfer gate 14 are connected to the control terminals of the clocked inverters 22, 23, respectively, in each of the delay sections 21a to 21f.

Figure 2:
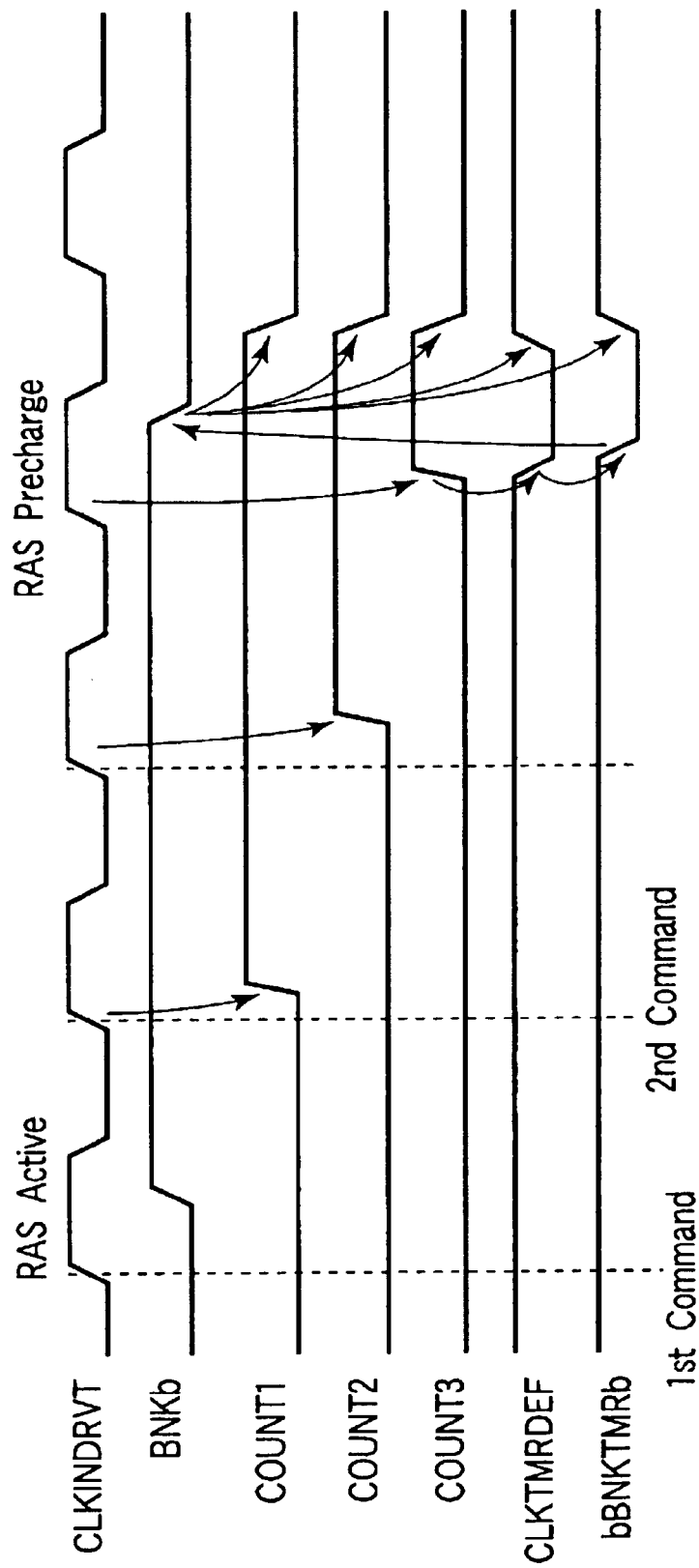
FIG. 2 is a timing chart to help explain the operation of the bank timer shown in FIG. 1.

Next, the operation of the bank timer 11 with the above configuration will be explained by reference to FIG. 2. When a first command WRA or RDA is received, signal BNKB goes high. In response to this, COUNT1 goes high after one clock cycle in the clock cycle counter circuit 11a enclosed by a dotted line in FIG. 1. After two clock cycles, COUNT2 goes high. After three clock cycles, COUNT3 goes high. When the high level of COUNT3 is received, signal CLKTMRDEF goes low after three clock cycles have elapsed since the first command. In response to this, signal bBNKTMRb goes low.

As the end time of RAS restore and the start time of RAS precharge, three clock cycles from the input of the first command are counted. On the assumption that the specification for random cycle (tRC) is five clocks, three clock cycles are counted as an example of ideal RAS restore time.

Signal bBNKTMRb, the output of the NAND gate 13, is inputted to the bank active controller 211 shown in FIG. 15. Signal bBNKTMRb causes signal BNKb to change to the low level. This completes the RAS restore operation and starts the RAS precharge operation.

The low level of signal BNKb resets the bank timer 11. Then, COUNT1, COUNT2, COUNT3 change to the low level and signals CLKTMRDEF and bBNKTMRb both change to the high level.

As described above, the bank timer 11 uses external clock signal VCLK to control the RAS restore time (tRAS). Specifically, the clock cycle time (tCK) of signal CLKINDRVT is counted, thereby setting the timing of the end of the RAS restore operation and the timing of the start of the RAS precharge operation. This makes it possible to set a stable RAS restore time in the FCRAM.

As described above, the self-timer is configured so as to count clock cycles using external clock signal VCLK. This makes it possible to suppress variations in the end time of the RAS restore operation and in the start time of the RAS precharge operation caused by variations in the power supply voltage, temperature, or processes.

Furthermore, the circuit is so configured that the RAS restore time depends on the clock cycle (tCK). This makes it possible to secure the RAS restore time sufficiently, even when the clock cycle is a long cycle. Therefore, in a series of operations in the FCRAM, including the RAS restore operation, the selection of column select lines CSL, and the RAS precharge operation, it is possible to avoid the following erroneous operation: the RAS precharge operation is started before a series of operations in the column-system circuits is completed, starting with the selection of column select lines CSL.

(Second Embodiment)

FIG. 3 shows a circuit configuration of a bank timer suitable for a synchronous semiconductor memory device (FCRAM) according to a second embodiment of the present invention. Explanation will be given about a case where use of a test mode and a fuse blowout enables the number of clock cycles in the RAS restore time to be changed.

A bank timer 31 is so configured that a setting circuit 32 enclosed by a dotted line is added to the bank timer 11 shown in FIG. 1. In this case, the setting circuit 32 includes exclusive OR gates 33a, 33b, inverters 34a, 34b, 34c, NOR gates 35a to 35d, an AND-to-NOR gate 36, clocked inverters 37a to 37d, and NAND gates 38a, 38b. The setting circuit 32 is inserted between the inverter 12d and delay section 21f in the final stage in the bank timer 11.

Test mode signal TMBKTMR<1> is inputted to one input terminal of the exclusive OR gate 33a. Test mode signal TMBKTMR<2> is inputted to one input terminal of the exclusive OR gate 33b. Fuse signals bFSBKTMR<1>, bFSBKTMR<2> are inputted to the other input terminals of the exclusive OR gates 33a, 33b, respectively. Test mode signals TMBKTMR<1>, TMBKTMR<2> are both at the low level in the initial state. Making an entry of test mode causes test mode signals TMBKTMR<1>, TMBKTMR<2> to change to the high level. Test mode signals TMBKTMR<1>, TMBKTMR<2> can be controlled independently.

Fuse signals bFSBKTMR<1>, bFSBKTMR<2> are both at the high level in the initial state. A fuse blowout causes fuse signals bFSBKTMR<1>, bFSBKTMR<2> to change to the low level. Fuse signals bFSBKTMR<1>, bFSBKTMR<2> can be controlled independently.

As described above, test mode signal TMBKTMR<1> and fuse signal bFSBKTMR<1> are inputted to the exclusive OR gate 33a. Test mode signal TMBKTMR<2> and fuse signal bFSBKTMR<2> are inputted to the exclusive OR gate 33b. This enables test mode signals TMBKTMR<1>, TMBKTMR<2> to change the setting of the RAS restore time even after the fuse blowout.

The output of the exclusive OR gate 33a is inputted to each of the NOR gates 35a, 35c and inverter 34a. The output of the inverter 34a is inputted to the NOR gates 35b, 35d. The output of the exclusive OR gate 33b is inputted to the NOR gates 35a, 35d and inverter 34b. The output of the inverter 34b is inputted to the NOR gates 35b, 35c.

The output CLKTMR<3> of the NOR gate 35a is supplied to one input terminal of a first AND gate of the AND-to-NOR gate 36. The output CLKTMRMOS of the NAND gate 24 in the delay section 21e is supplied to the other input terminal of the first AND gate. The output CLKTMR<0> of the NOR gate 35b is supplied to one input terminal of a second AND gate of the AND-to-NOR gate 36. The output CLKTMRDEF of the NAND gate 24 in the delay section 21f in the final stage is supplied to the other input terminal of the second AND gate. The output CLKTMR<1> of the NOR gate 35c is supplied to one input terminal of a third AND gate of the AND-to-NOR gate 36. The output CLKTMRP05 of the NAND gate 38a is supplied to the other input terminal of the third AND gate. The output CLKTMR<2> of the NOR gate 35d is supplied to one input terminal of a fourth AND gate of the AND-to-NOR gate 36. The output CLKTMRP10 of the NAND gate 38b is supplied to the other input terminal of the fourth AND gate. The output of the NAND-to-NOR gate 36 is supplied via the inverters 34c, 12d to the other input terminal of the NAND gate 13.

As described above, in the initial state, test mode signals TMBKTMR<1>, TMBKTMR<2> are both at the low level. Fuse signals bFSBKTMR<1>, bFSBKTMR<2> are both at the high level. In this case, the output CLKTMR<0> of the NOR gate 35b becomes effective. Specifically, the output CLKTMRDEF of the NAND gate 24 in the delay section 21f in the final stage inputted to the AND-to-NOR gate 36 becomes effective. In this case, the RAS restore time with the number of clock cycles being 3 is secured as in the bank timer 11 of the first embodiment.

Next, a case where test mode signal TMBKTMR<1> changes to the high level or fuse signal bFSBKTMR<1> changes to the low level will be explained. In this case, the output CLKTMR<1> of the NOR gate 35c becomes effective. Specifically, the output CLKTMRP05 of the NAND gate 38a inputted to the AND-to-NOR gate 36 becomes effective. Thus, in this case, the RAS restore time with the number of clock cycles being 3.5 is secured.

Next, a case where test mode signal TMBKTMR<1> changes to the high level after fuse signal bFSBKTMR<1> changes to the low level as a result of a fuse blowout will be explained. In this case, the output CLKTMR<0> of the NOR gate 35b becomes effective as in the initial state. Therefore, the RAS restore time with the number of clock cycles being 3 is secured.

Next, a case where test mode signal TMBKTMR<2> changes to the high level or fuse signal bFSBKTMR<2> changes to the low level will be explained. In this case, the output CLKTMR<2> of the NOR gate 35d becomes effective. Specifically, the output CLKTMRP10 of the NAND gate 38b inputted to the AND-to-NOR gate 36 becomes effective. Thus, in this case, the RAS restore time with the number of clock cycles being 4 is secured.

Next, a case where test mode signal TMBKTMR<2> changes to the high level after fuse signal bFSBKTMR<2> changes to the low level as a result of a fuse blowout will be explained. In this case, the output CLKTMR<0> of the NOR gate 35b becomes effective as in the initial state. Therefore, the RAS restore time with the number of clock cycles being 3 is secured.

The following is an explanation of a case where test mode signal TMBKTMR<1> changes to the high level or fuse signal bFSBKTMR<1> changes to the low level or where test mode signal TMBKTMR<2> changes to the high level or fuse signal bFSBKTMR<2> changes to the low level. In this case, the output CLKTMR<3> of the NOR gate 35a becomes effective. Specifically, the output CLKTMRM05 of the NAND gate 24 in the delay section 21e inputted to the AND-to-NOR gate 36 becomes effective. Thus, in this case, the RAS restore time with the number of clock cycles being 2.5 is secured.

Next, explanation will be given about a case where test mode signals TMBKTMR<1>, TMBKTMR<2> both change to the high level after fuse signals bFSBKTMR<1>, bFSBKTMR<2> both change to the low level as a result of a fuse blowout. In this case, the output CLKTMR<0> of the NOR gate 35b becomes effective as in the initial state. Thus, in this case, the RAS restore time with the number of clock cycles being 3 is secured.

With the above configuration, the change of the RAS restore time can be set in units of 0.5 clock cycles. In the above configuration, test mode signals TMBKTMR<1>, <2> and fuse signals bFSBKTMR<1>, <2> are received by the exclusive OR gates 33a, 33b, which makes it possible to change the setting of the test mode to the default setting by effecting a fuse blowout after a check is made in the test mode. Making an entry of test mode after effecting a fuse blowout enables the test mode to be returned to the initial state before the fuse blowout.

In the second embodiment, two kinds of test mode signals and two kinds of fuse signals have been used. Use of more test mode signals and more fuse signals enables a larger number of clock cycles to be set in units of 0.5 clock cycles.

(Third Embodiment)

Figure 4:
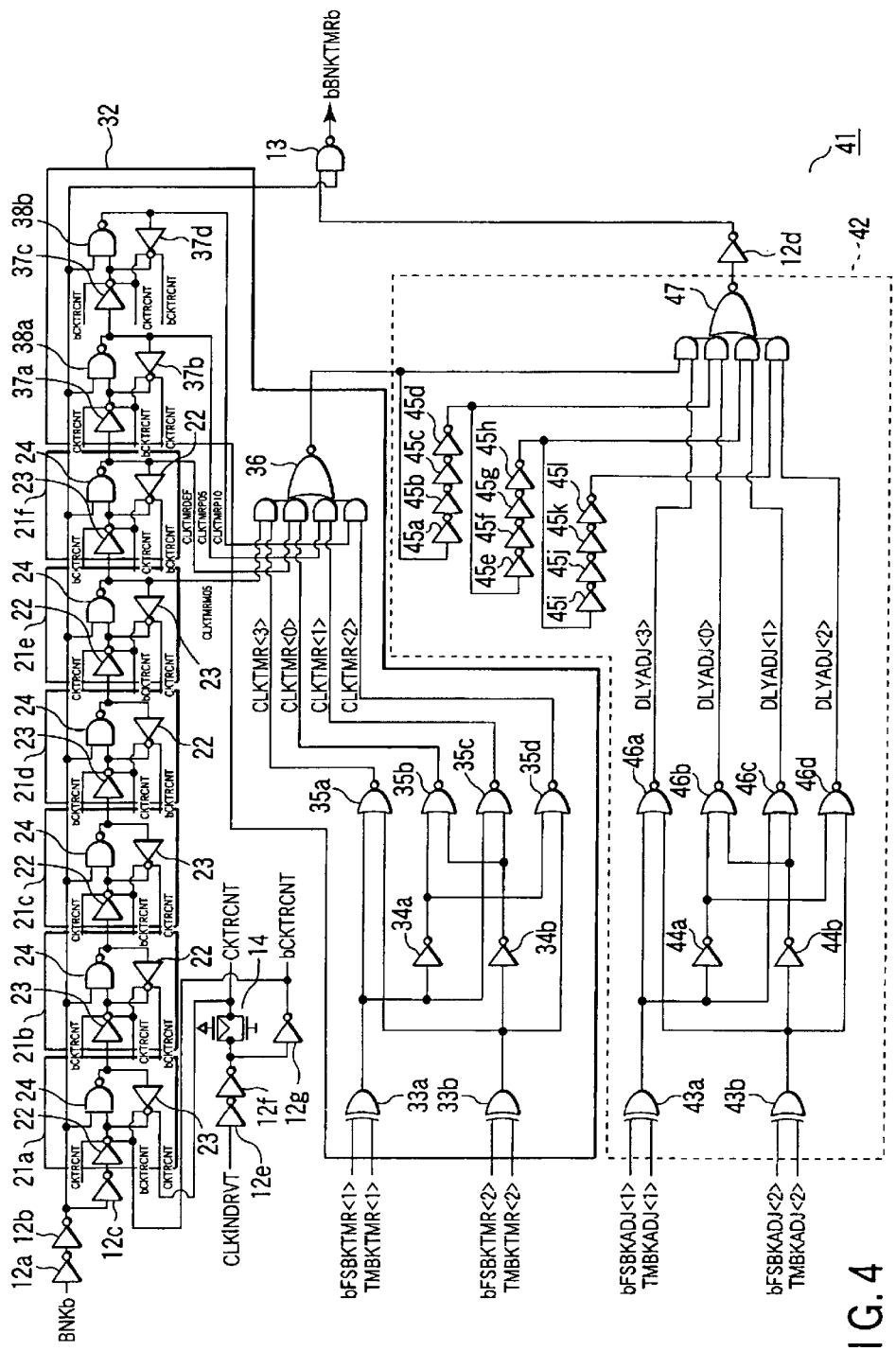
FIG. 4 is a circuit diagram showing a configuration of a bank timer used in an FCRAM according to a third embodiment of the present invention.

FIG. 4 shows a circuit configuration of a bank timer suitable for a synchronous semiconductor memory device (FCRAM) according to a third embodiment of the present invention. Explanation will be given about a case where use of a test mode and a fuse blowout enables fine adjustment of the RAS restore time.

A bank timer 41 is so configured that a fine adjustment circuit 42 enclosed by a dotted line is added to the bank timer 31 shown in FIG. 3. In this case, the fine adjustment circuit 42 includes exclusive OR gates 43a, 43b, inverters 44a, 44b, 45a to 45l, NOR gates 46a to 46d, and an AND-to-NOR gate 47. The fine adjustment circuit 42 is inserted in place of the inverter 34c in the bank timer 31.

Test mode signal TMBKADJ<1> is inputted to one input terminal of the exclusive OR gate 43a. Test mode signal TMBKADJ<2> is inputted to one input terminal of the exclusive OR gate 43b. Fuse signals bFSBKADJ<1>, bFSBKADJ<2> are inputted to the other input terminals of the exclusive OR gates 43a, 43b, respectively.

Test mode signals TMBKADJ<1>, TMBKADJ<2> are both at the low level in the initial state. Making an entry of test mode causes test mode signals TMBKADJ<1>, TMBKADJ<2> to change to the high level. Test mode signals TMBKADJ<1>, TMBKADJ<2> can be controlled independently.

Fuse signals bFSBKADJ<1>, bFSBKADJ<2> are both at the high level in the initial state. A fuse blowout causes fuse signals bFSBKADJ<1>, bFSBKADJ<2> to change to the low level. Fuse signals bFSBKADJ<1>, bFSBKADJ<2> can be controlled independently.

As described above, test mode signal TMBKADJ<1> and fuse signal bFSBKADJ<1> are inputted to the exclusive OR gate 43a. Test mode signal TMBKADJ<2> and fuse signal bFSBKADJ<2> are inputted to the exclusive OR gate 43b. This enables test mode signals TMBKADJ<1>, TMBKADJ<2> to change the setting of the RAS restore time even after the fuse blowout.

The output of the exclusive OR gate 43a is inputted to each of the NOR gates 46a, 46c and inverter 44a. The output of the inverter 44a is inputted to the NOR gates 46b, 46d. The output of the exclusive OR gate 43b is inputted to the NOR gates 46a, 46d and inverter 44b. The output of the inverter 44b is inputted to the NOR gates 46b, 46c.

The output DLYADJ<3> of the NOR gate 46a is supplied to one input terminal of a first AND gate of the AND-to-NOR gate 47. The output of the AND-to-NOR gate 36 in the setting circuit 32 is supplied directly to the other input terminal of the first AND gate. The output DLYADJ<0> of the NOR gate 46b is supplied to one input terminal of a second AND gate of the AND-to-NOR gate 47. The output of the AND-to-NOR gate 36 in the setting circuit 32 is supplied via the inverters 45a to 45d to the other input terminal of the second AND gate. The output DLYADJ<1> of the NOR gate 46c is supplied to one input terminal of a third AND gate of the AND-to-NOR gate 47. The output of the AND-to-NOR gate 36 in the setting circuit 32 is supplied via the inverters 45a to 45h to the other input terminal of the third AND gate. The output DLYADJ<2> of the NOR gate 46d is supplied to one input terminal of a fourth AND gate of the AND-to-NOR gate 47. The output of the AND-to-NOR gate 36 in the setting circuit 32 is supplied via the inverters 45a to 45l to the other input terminal of the fourth AND gate. The output of the AND-to-NOR gate 47 is supplied via the inverter 12d to the other input terminal of the NAND gate 13.

As described above, in the initial state, test mode signals TMBKADJ<1>, TMBKADJ<2> are both at the low level. Fuse signals bFSBKADJ<1>, bFSBKADJ<2> are both at the high level. In this case, the output DLYADJ<0> of the NOR gate 46b becomes effective. Specifically, the outputs of the inverters 45a to 45d inputted to the AND-to-NOR gate 47 become effective. In this case, the RAS restore time with four stages of delay in the inverters 45a to 45d is secured.

The following is an explanation of a case where test mode signal TMBKADJ<1> changes to the high level or fuse signal bFSBKADJ<1> changes to the low level. In this case, the output DLYADJ<1> of the NOR gate 46c becomes effective. Specifically, the outputs of the inverters 45a to 45h inputted to the AND-to-NOR gate 47 become effective. Thus, in this case, the RAS restore time with eight stages of delay in the inverters 45a to 45h is secured.

Next, a case where test mode signal TMBKADJ<1> changes to the high level after fuse signal bFSBKADJ<1> changes to the low level as a result of a fuse blowout will be explained. In this case, the output DLYADJ<0> of the NOR gate 46b becomes effective as in the initial state. Therefore, in this case, the RAS restore time with four stages of delay in the inverters 45a to 45d is secured.

Next, a case where test mode signal TMBKADJ<2> changes to the high level or fuse signal bFSBKADJ<2> changes to the low level will be explained. In this case, the output DLYADJ<2> of the NOR gate 46d becomes effective. Specifically, the outputs of the inverters 45a to 45l inputted to the AND-to-NOR gate 47 become effective. Thus, in this case, the RAS restore time with 12 stages of delay in the inverters 45a to 45l is secured.

Next, a case where test mode signal TMBKADJ<2> changes to the high level after fuse signal bFSBKADJ<2> changes to the low level as a result of a fuse blowout will be explained. In this case, the output DLYADJ<0> of the NOR gate 46b becomes effective as in the initial state. Therefore, the RAS restore time with four stages of delay in the inverters 45a to 45d is secured.

The following is an explanation of a case where test mode signal TMBKADJ<1> changes to the high level or fuse signal bFSBKADJ<1> changes to the low level or where test mode signal TMBKADJ<2> changes to the high level or fuse signal bFSBKADJ<2> changes to the low level. In this case, the output DLYADJ<3> of the NOR gate 46a becomes effective. Specifically, the output of the AND-to-NOR gate 36 directly inputted to the AND-to-NOR gate 47 becomes effective. Thus, in this case, the RAS restore time without any stage of delay in the inverters 45a to 45l is secured.

Next, explanation will be given about a case where test mode signals TMBKADJ<1>, TMBKADJ<2> both change to the high level after fuse signals bFSBKADJ<1>, bFSBKADJ<2> both change to the low level as a result of a fuse blowout. In this case, the output DLYADJ<0> of the NOR gate 46b becomes effective as in the initial state. Thus, in this case, the RAS restore time with four stages of delay in the inverters 45a to 45d is secured.

As described above, the above configuration enables fine adjustment of the setting of the RAS restore time.

In the third embodiment, the RAS restore time fine adjustment circuit 42 has been composed of inverters. The present invention is not limited to this. For instance, similar control can be realized by using CR delay circuits or other circuits in place of inverters.

In the above configuration, test mode signals TMBKADJ and fuse signals bFSBKADJ are received by the exclusive OR gates 43a, 43b, which makes it possible to change the setting of the test mode to the default setting by effecting a fuse blowout after a check is made in the test mode. Making an entry of test mode after effecting a fuse blowout enables the test mode to be returned to the initial state before the fuse blowout.

In the third embodiment, two kinds of test mode signals and two kinds of fuse signals have been used as an example. Use of more test mode signals and more fuse signals makes it possible to make fine adjustment of more different times.

(Fourth Embodiment)

FIG. 5 shows a circuit configuration of a bank timer suitable for a synchronous semiconductor memory device (FCRAM) according to a fourth embodiment of the present invention. A case where a bank timer that enables the number of clock cycles in the RAS restore time and fine adjustment of the RAS restore time to be set independently by means of CAS latency (CL) will be explained. The explanation is based on the assumption that there are two types of CAS latency CL, CL3 and CL4.

When CAS latency CL changes from CL3 to CL4, the clock cycle time (tCK) determined in the specification basically tends to become shorter. For this reason, when setting is done in such a manner that the count of the number of clock cycles in the RAS restore time with CL3 is equal to that with CL4, the RAS restore time with CL4 is shorter than the with CL3. To overcome this problem, independent control of the number of clock cycles in the RAS restore time and fine adjustment of the RAS restore time is made possible according to CAS latency. This prevents the RAS restore time with CL4 from becoming shorter than that with CL3.

In FIG. 5, a bank timer 51 is such that, for example, the input section for test mode signals TMBKTMR<1>, TMBKTMR<2>, TMBKADJ<1>, TMBKADJ<2>, and fuse signals bFSBKTMR<1>, bFSBKTMR<2>, bFSBKADJ<1>, bFSBKADJ<2> in the bank timer 41 of FIG. 4 is replaced with an input circuit 52 enclosed by a dotted line. That is, a setting section 32' and a fine adjustment section 42' that include the input circuit 52 are added to the bank timer shown in FIG. 1. In this case, the input circuit 52 is composed of exclusive OR gates 53a to 53h, transfer gates 54a to 54h, and an inverter 55.

Specifically, in the bank timer 51, to enable independent control using CL3 and CL4, eight input signals, TMBKTMRCL3<1>, TMBKTMRCL4<1>, TMBKTMRCL3<2>, TMBKTMRCL4<2>, TMBKADJCL3<1>, TMBKADJCL4<1>, TMBKADJCL3<2>, TMBKADJCL4<2>, are prepared in place of test mode signals TMBKTMR<1>, TMBKTMR<2>, TMBKADJ<1>, TMBKADJ<2> shown in FIG. 4.

Similarly eight input signals, bFSBKTMRCL3<1>, bFSBKTMRCL4<1>, bFSBKTMRCL3<2>, bFSBKTMRCL4<2>, bFSBKADJCL3<1>, bFSBKADJCL4<1>, bFSBKADJCL3<2>, bFSBKADJCL4<2>, are prepared in place of fuse signals bFSBKTMR<1>, bFSBKTMR<2>, bFSBKADJ<1>, bFSBKADJ<2>.

The test mode signal TMBKTMRCL3<1> is inputted to one input terminal of the exclusive OR gate 53a. The fuse signal bFSBKTMRCL3<1> is inputted to the other input terminal of the exclusive OR gate 53a. The output of the exclusive OR gate 53a is inputted via the transfer gate 54a to each of the NOR gates 35a, 35c and the inverter 34a. The output of the inverter 34a is inputted to each of the NOR gates 35b, 35d.

The test mode signal TMBKTMRCL4<1> is inputted to one input terminal of the exclusive OR gate 53b. The fuse signal bFSBKTMRCL4<1> is inputted to the other input terminal of the exclusive OR gate 53b. The output of the exclusive OR gate 53b is inputted via the transfer gate 54b to each of the NOR gates 35a, 35c and the inverter 34a.

The test mode signal TMBKTMRCL3<2> is inputted to one input terminal of the exclusive OR gate 53c. The fuse signal bFSBKTMRCL3<2> is inputted to the other input terminal of the exclusive OR gate 53c. The output of the exclusive OR gate 53c is inputted via the transfer gate 54c to each of the NOR gates 35a, 35d and the inverter 34b. The output of the inverter 34b is inputted to each of the NOR gates 35b, 35c.

The test mode signal TMBKTMRCL4<2> is inputted to one input terminal of the exclusive OR gate 53d. The fuse signal bFSBKTMRCL4<2> is inputted to the other input terminal of the exclusive OR gate 53d. The output of the exclusive OR gate 53d is inputted via the transfer gate 54d to each of the NOR gates 35a, 35d and the inverter 34b.

The test mode signal TMBKADJCL3<1> is inputted to one input terminal of the exclusive OR gate 53e. The fuse signal bFSBKADJCL3<1> is inputted to the other input terminal of the exclusive OR gate 53e. The output of the exclusive OR gate 53e is inputted via the transfer gate 54e to each of the NOR gates 46a, 46c and the inverter 44a. The output of the inverter 44a is inputted to each of the NOR gates 46b, 46d.

The test mode signal TMBKADJCL4<1> is inputted to one input terminal of the exclusive OR gate 53f. The fuse signal bFSBKADJCL4<1> is inputted to the other input terminal of the exclusive OR gate 53f. The output of the exclusive OR gate 53f is inputted via the transfer gate 54f to each of the NOR gates 46a, 46c and the inverter 44a.

The test mode signal TMBKADJCL3<2> is inputted to one input terminal of the exclusive OR gate 53g. The fuse signal bFSBKADJCL3<2> is inputted to the other input terminal of the exclusive OR gate 53g. The output of the exclusive OR gate 53g is inputted via the transfer gate 54g to each of the NOR gates 46a, 46d and the inverter 44b. The output of the inverter 44b is inputted to each of the NOR gates 46b, 46c.

The test mode signal TMBKADJCL4<2> is inputted to one input terminal of the exclusive OR gate 53h. The fuse signal bFSBKADJCL4<2> is inputted to the other input terminal of the exclusive OR gate 53h. The output of the exclusive OR gate 53h is inputted via the transfer gate 54h to each of the NOR gates 46a, 46d and the inverter 44b.

When CL3 is used, the transfer gates 54a, 54c, 54e, 54g of the transfer gates 54a to 54h become effective. When CL4 is used, the transfer gates 54b, 54d, 54f, 54h become effective.

A case where input signal TMBKTMRCL4<1> is made high in the initial state in the above circuit will be explained. At this time, with CL3, since test mode signal TMBKTMRCL4<1> has nothing to do with the setting of the number of clock cycles, the output CLKTMR<0> of the NOR gate 35b becomes effective. As a result, the RAS restore time with the number of clock cycles being 3 is secured.

In contrast, with CL4, because test mode signal TMBKTMRCL4<1> is at the high level, the output CLKTMR<1> of the NOR gate 35c becomes effective. As a result, the RAS restore time with the number of clock cycles being 3.5 is secured.

Similarly, test mode signal TMBKADJCL4<1> is made high in the initial state. At this time, with CL3, test mode signal TMBKADJCL4<1> has nothing to do with fine adjustment of the RAS restore time, the output DLYADJ<0> of the NOR gate 46b becomes effective. As a result, the RAS restore time with four stages of delay in the inverters 45a to 45d is secured.

In contrast, with CL4, because test mode signal TMBKADJCL4<1> is at the high level, the output DLYADJ<1> of the NOR gate 46c becomes effective. As a result, the RAS restore time with eight stages of delay in the inverters 45a to 45h is secured.

With the above configuration, the setting of the RAS restore time can be controlled independently according to CAS latency CL.

(Fifth Embodiment)

FIG. 6 shows a configuration of a control circuit for controlling the timing of the change of CAS latency CL according to a fifth embodiment of the present invention. A case where the circuit is configured so as to control the change of CAS latency CL after the precharge operation of the ROW system is started.

In FIG. 6, external clock signal VCLK and signal VBCLK are inputted to an input receiver circuit 61, which then outputs signal CLKINT. The potential VBCS of the /CS pin is inputted to an input receiver circuit 62, which then outputs signal bCSIN. The potential VFN of the FN pin is inputted to an input receiver circuit 63, which then outputs signal FNIN. Signal VA is inputted to an input receiver circuit 64, which then outputs signal AIN.

Signal CLKINT, the output of the input receiver circuit 61, and signal bCSIN, the output of the input receiver circuit 62, are inputted to an input latch circuit 65, which then outputs signal bCSLTC. Signal CLKINT, the output of the input receiver circuit 61, and signal FNIN, the output of the input receiver circuit 63, are inputted to an input latch circuit 66, which then outputs signal FNLTC. Signal CLKINT, the output of the input receiver circuit 61, and signal AIN, the output of the input receiver circuit 64, are inputted to an input latch circuit 67, which then outputs signal AILTC.

Signal CLKINT, the output of the input receiver circuit 61, signal bCSLTC, the output of the input latch circuit 65, and signal FNLTC, the output of the input latch circuit 66, are inputted to a command decoder circuit 68, which then outputs various commands, including ACTV, WRITE, READ, REFR, MRS. Second command MRS, the output of the command decoder circuit 68, signal AILTC, the output of the input latch circuit 67, and bank active signal BNKb are inputted to a CL decoder 69, which then outputs CAS latencies CL3, CL4.

Figure 7:
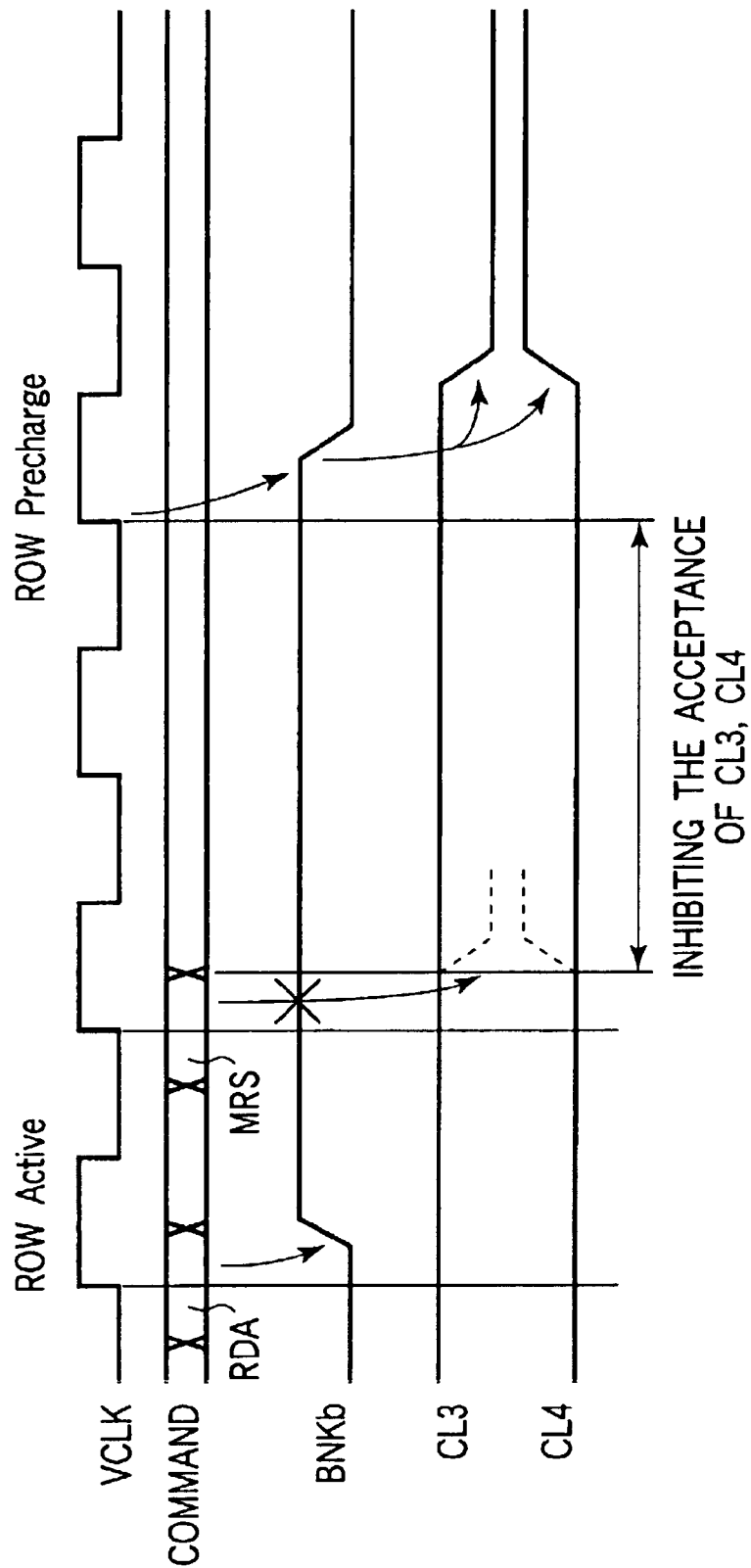
FIG. 7 is a timing chart to help explain the operation of the control circuit shown in FIG. 6.
Figure 8:
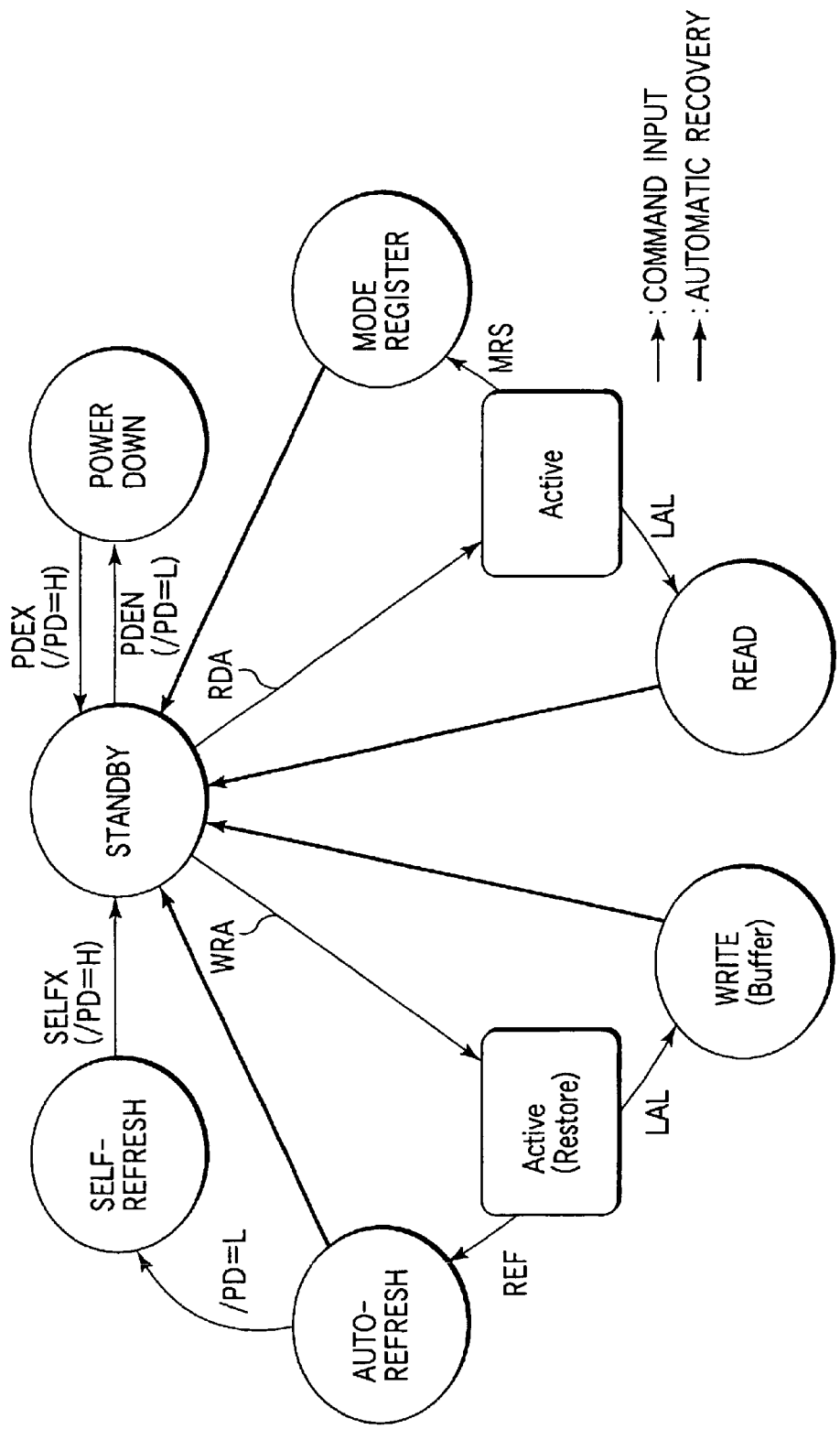
FIG. 8 schematically shows how the state of the FCRAM changes according to command input.
Figure 10:
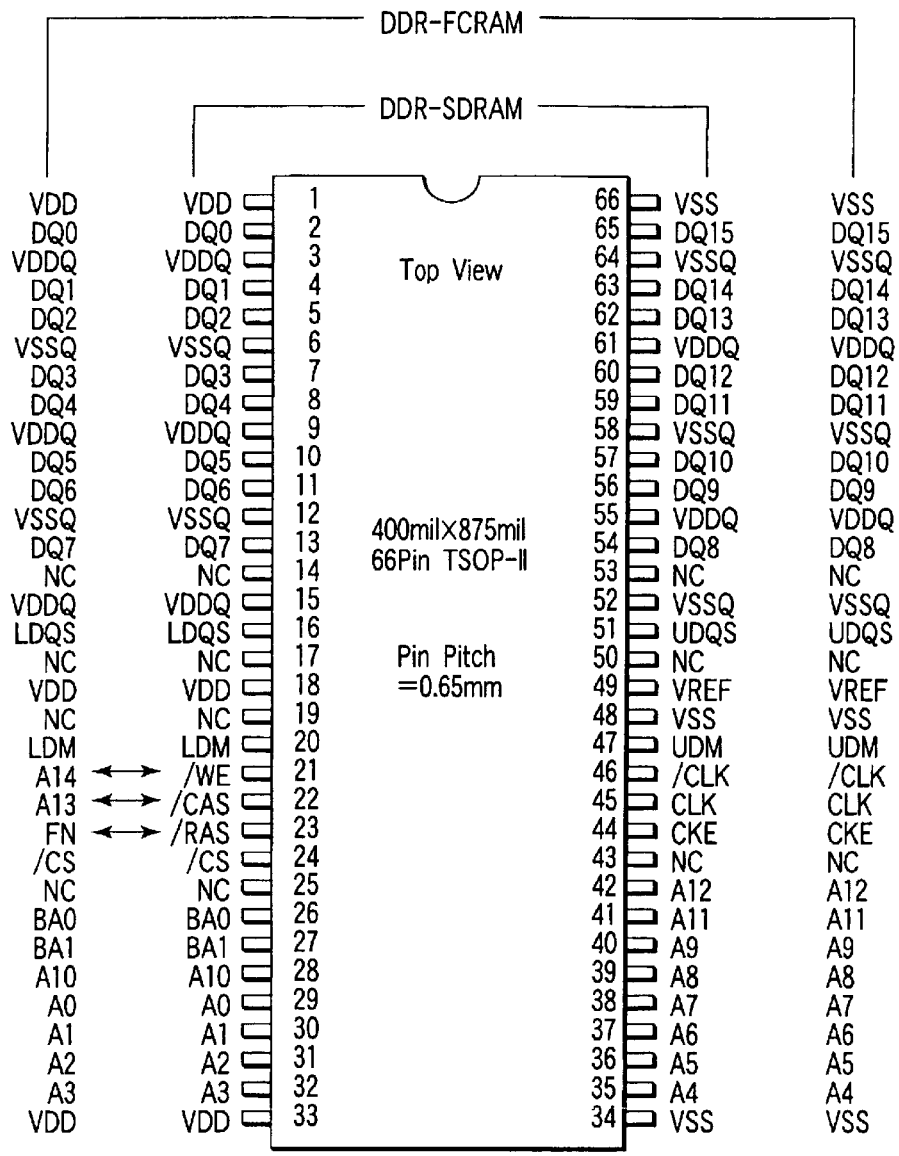
FIG. 10 shows the pin allocation of a DDR-FCRAM package as compared with the pin allocation of a DDR-SDRAM package.
Figure 14:
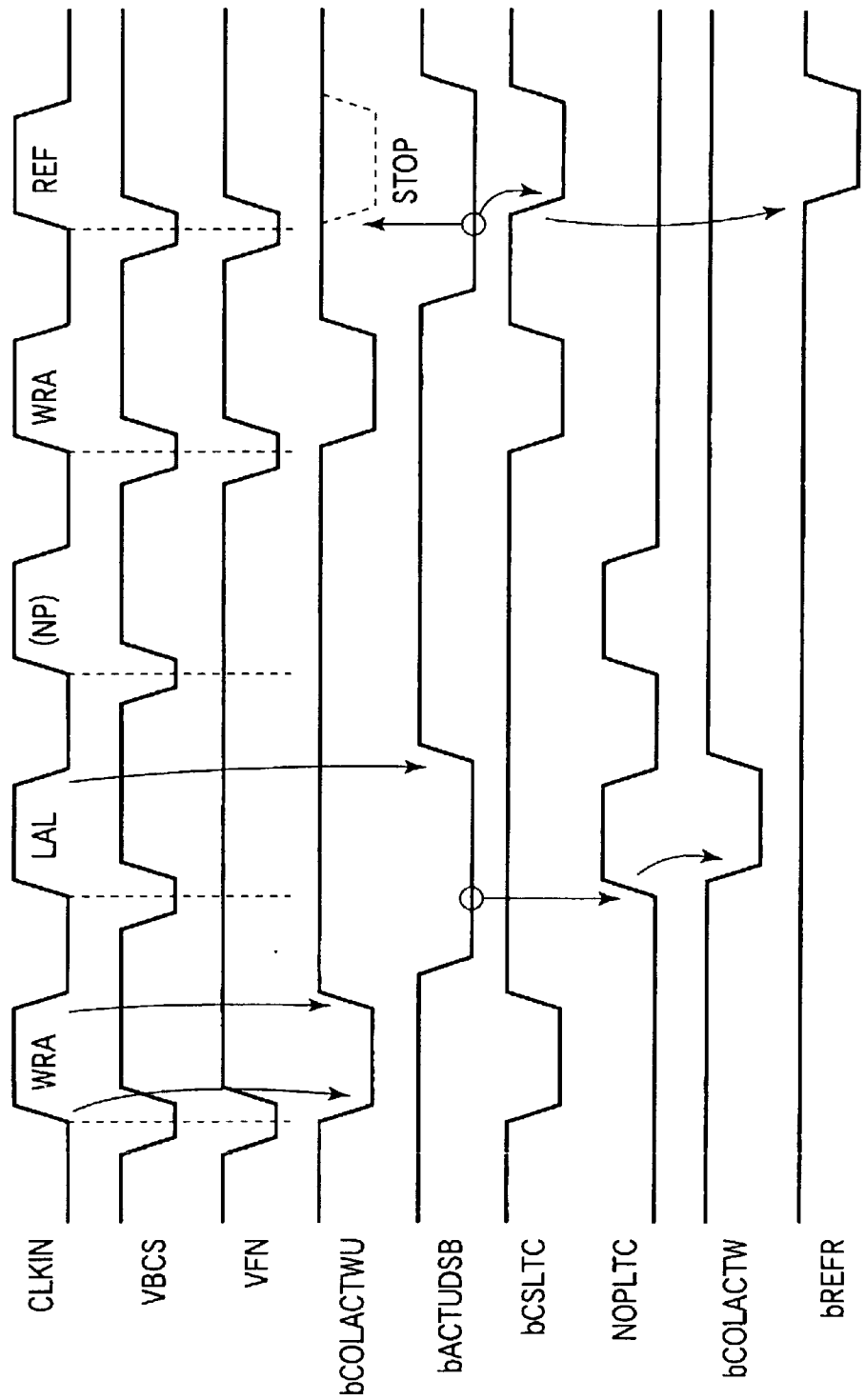
FIG. 14 is a timing chart to help explain the operation of the command decoder.
Figure 16:
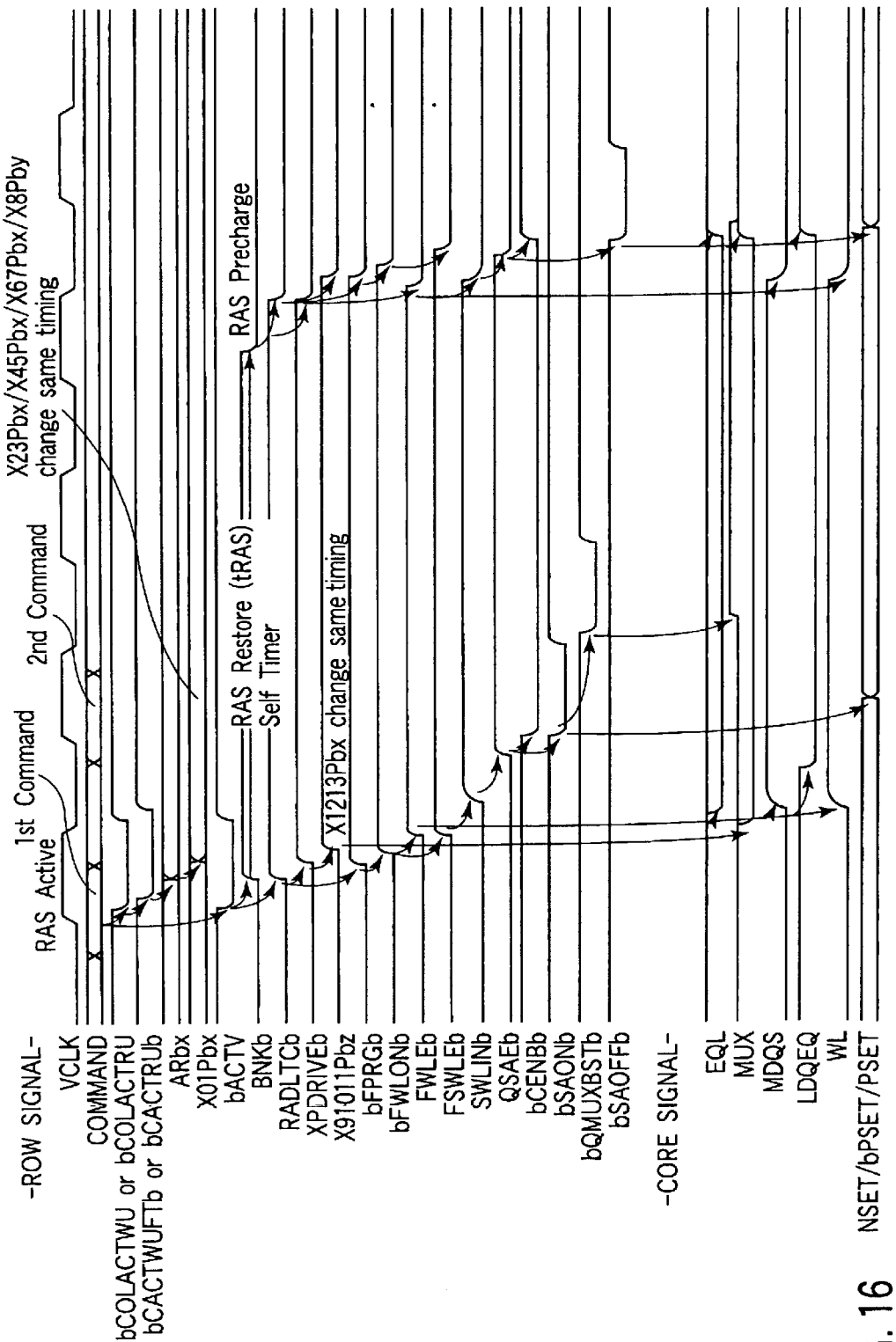
FIG. 16 is a timing chart to help explain the operation of the ROW control circuit shown in FIG. 15.
Figure 18:
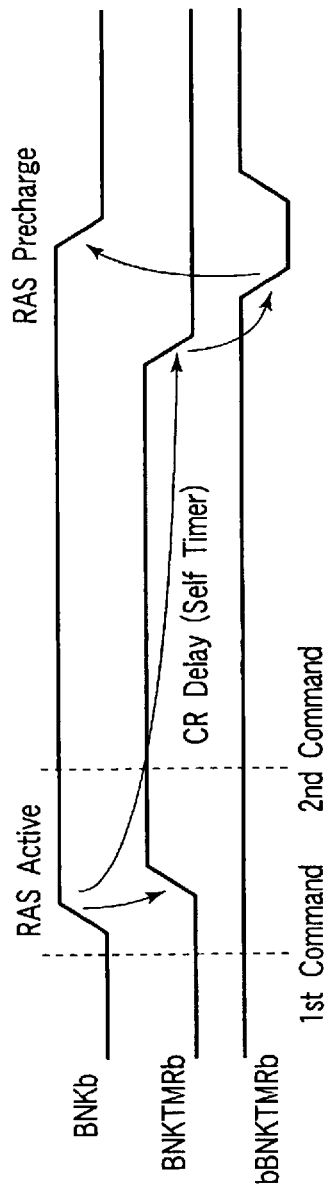
FIG. 18 is a timing chart to help explain the operation of the bank timer shown in FIG. 17.
Figure 19:
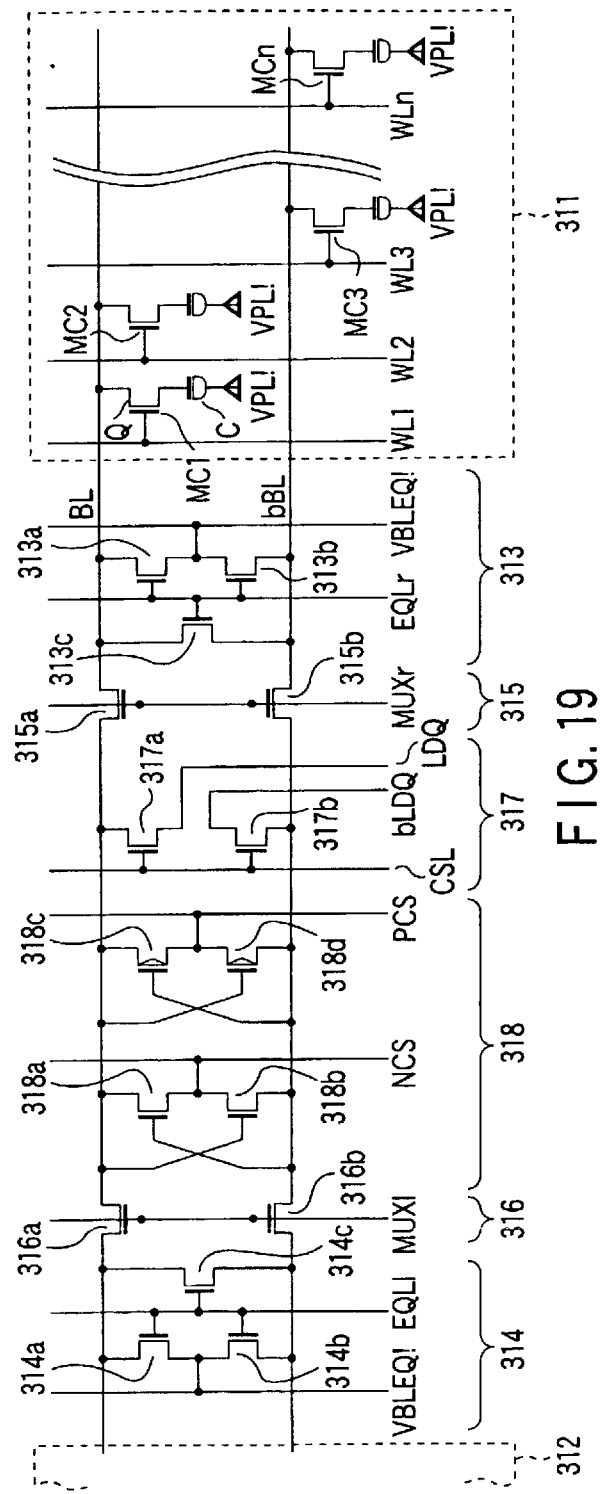
FIG. 19 is a circuit diagram showing a configuration of a general core in the FCRAM.
Figure 20:
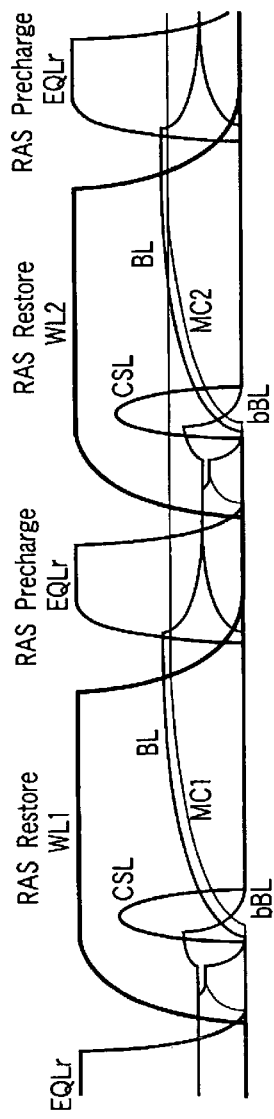
FIG. 20 is a waveform diagram to help explain the operation of the core (or storage nodes in the cells), taking the operation of writing "1" data as an example.
Figure 21:
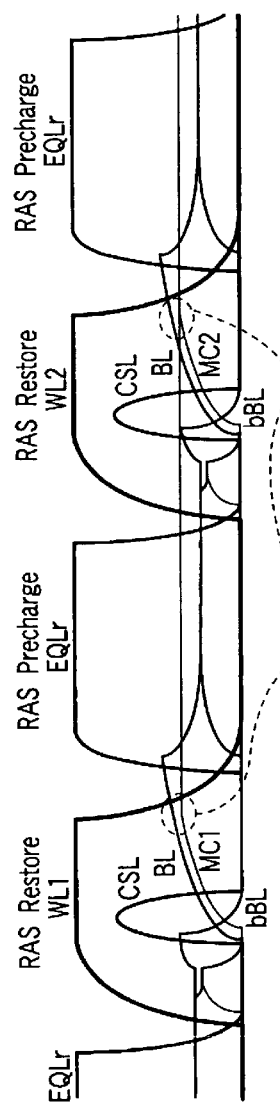
FIG. 21 is a waveform diagram to help explain insufficient restore in a cell due to a decrease in the RAS restore time.
Figure 22:
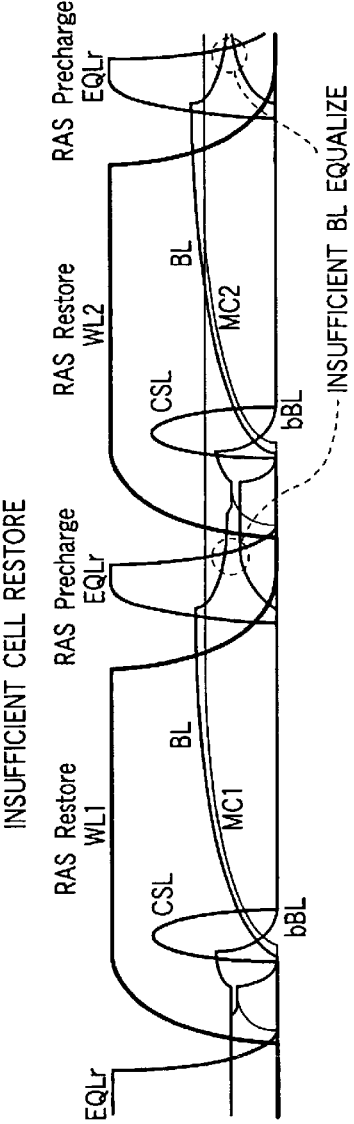
FIG. 22 is a waveform diagram to help explain insufficient equalize on a bit line due to a decrease in the RAS precharge time.

Next, the operation of the control circuit with the above configuration will be explained by reference to FIG. 7.

As for the command form in the FCRAM, a mode register set is recognized by combining a first command RDA and a second command MRS. In this case, use of only a first command makes it impossible to distinguish between a read operation and a mode register set. Thus, bank active signal BNKb for controlling the ROW system goes high, thereby starting the active operation of the ROW system. Then, when use of a second command MRS enables the mode register set to be recognized after this operation is completed, the mode, such as CAS latency (CL) or burst length (BL), is changed.

It is assumed that the bank timer using CL control receives a second command MRS during the RAS active operation and immediately switches between CAS latency CL3 and CAS latency CL4. In this case, there is a possibility that the clock cycle counter circuit in the bank timer will malfunction.

To overcome this problem, bank active signal BNKb is inputted to the CL decoder 69 as shown in FIG. 6. Then, when bank active signal BNKb goes low, CAS latency CL3 changes to CAS latency CL4 or vice versa.

As described above, when the precharge operation of the ROW system is started, or when the operation of the counter in the bank timer is completed, CAS latency CL3 changes to CAS latency CL4 or vice versa. This enables the clock cycle counter circuit to continue the proper operation even in the bank timer using CL control.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A synchronous semiconductor memory device comprising:
    a memory section which includes a memory cell array having a plurality of memory cells and which is capable of a read operation of reading information from said memory cells according to a read command and a write operation of writing information into said memory cells according to a write command;
    a command sensing circuit which senses whether a first command inputted in synchronization with an external clock signal is said read command or said write command; and
    a bank timer circuit which, when said command sensing circuit has sensed either said read command or said write command, sets the end time of the restore operation of a row address strobe (RAS) and the start time of the precharge operation of said RAS according to said external clock signal.

2. The synchronous semiconductor memory device according to claim 1, wherein
    said command sensing circuit takes in said first command and said second command in that order in synchronization with said external clock signal and which, when said first command is said write command, senses whether said second command is said write command or an auto refresh command and, when said first command is said read command, senses whether said second command is said read command or a mode register set command, and produces corresponding sense signals.

3. The synchronous semiconductor memory device according to claim 1, wherein
    said memory section carries out access to a core, the selection of column select lines, and precharge operations in a pipeline manner.

4. The synchronous semiconductor memory device according to claim 1, wherein
    said bank timer circuit is provided in a ROW control circuit section for controlling the ROW system of said memory section.

5. The synchronous semiconductor memory device according to claim 1, wherein
    said bank timer circuit sets the time required for the restore operation of said RAS by counting the number of clock cycles in said external clock signal.

6. The synchronous semiconductor memory device according to claim 5, wherein
    said bank timer circuit is capable of changing said number of clock cycles to be counted, according to the setting of a test mode.

7. The synchronous semiconductor memory device according to claim 5, wherein
    said bank timer circuit is capable of making fine adjustment of the time required for the restore operation of said RAS according to the setting of a test mode.

8. The synchronous semiconductor memory device according to claim 5, wherein
    said bank timer circuit is capable of changing said number of clock cycles to be counted, by means of a fuse blowout.

9. The synchronous semiconductor memory device according to claim 5, wherein
    said bank timer circuit is capable of making fine adjustment of the time required for the restore operation of said RAS by means of a fuse blowout.

10. The synchronous semiconductor memory device according to claim 5, wherein
    said bank timer circuit is capable of changing said number of clock cycles to be counted by the switching of column address strobe (CAS) latency.

11. The synchronous semiconductor memory device according to claim 10, wherein
    said bank timer circuit changes said CAS latency when the precharge operation of the ROW system is started.

12. The synchronous semiconductor memory device according to claim 5, wherein
    said bank timer circuit is capable of making fine adjustment of the time required for the restore operation of said RAS by the switching of CAS latency.

13. The synchronous semiconductor memory device according to claim 1, wherein
    said bank timer circuit is capable of, after changing the number of clock cycles by test mode entry to verify the operation, setting the same number of clock cycles as that in the test mode as a default by means of a fuse blowout.

14. The synchronous semiconductor memory device according to claim 13, wherein
    said bank timer circuit is capable of, after setting the number of clock cycles changed by a fuse blowout as a default, returning the number of clock cycles by test mode entry to the initial setting before the fuse blowout.

15. The synchronous semiconductor memory device according to claim 1, wherein
    said bank timer circuit is capable of, after changing fine adjustment of the time required for the restore operation of said RAS by test mode entry to verify the operation, setting the same fine adjustment time as that in the test mode as a default by means of a fuse blowout.

16. The synchronous semiconductor memory device according to claim 15, wherein said bank timer circuit is capable of, after setting the fine adjustment time changed by a fuse blowout as a default, returning the fine adjustment time by test mode entry to the initial setting before the fuse blowout.

17. The synchronous semiconductor memory device according to claim 1, wherein said bank timer circuit includes a first inverter to which a bank active signal is supplied, a second inverter to which the output of the first inverter is supplied, a third inverter to which the output of the second inverter is supplied, a delay circuit composed of a series connection of a plurality of delay sections to each of which the output of said second inverter is supplied, a fourth inverter to which the output of the delay circuit is supplied, and a NAND gate to which the output of the fourth inverter and the output of said second inverter are supplied.

18. The synchronous semiconductor memory device according to claim 17, wherein said delay circuit has a delay section at its first stage to which the output of said third inverter is supplied.

19. The synchronous semiconductor memory device according to claim 17, wherein said bank timer circuit has a setting circuit which is inserted between said delay circuit and said fourth inverter and which is for changing the number of clock cycles in the RAS restore time by means of test mode and a fuse blowout.

20. The synchronous semiconductor memory device according to claim 19, wherein said bank timer circuit has a fine adjustment circuit which is inserted between said setting circuit and said fourth inverter and which is for enabling fine adjustment of the RAS restore time by means of test mode and a fuse blowout.

21. The synchronous semiconductor memory device according to claim 20, wherein said setting circuit and said fine adjustment circuit include an input circuit for enabling the number of clock cycles in the RAS restore time and fine adjustment to be set independently by CAS latency.

* * * * *